US012334334B2

(12) United States Patent
Hashimoto et al.

(10) Patent No.: US 12,334,334 B2
(45) Date of Patent: Jun. 17, 2025

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: Kokusai Electric Corporation, Tokyo (JP)

(72) Inventors: Yoshitomo Hashimoto, Toyama (JP); Tomoki Fuji, Toyama (JP); Hiroki Yamashita, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 621 days.

(21) Appl. No.: 17/569,559

(22) Filed: Jan. 6, 2022

(65) Prior Publication Data

US 2022/0246422 A1 Aug. 4, 2022

(30) Foreign Application Priority Data

Jan. 29, 2021 (JP) ................................. 2021-013923

(51) Int. Cl.
*H01L 21/02* (2006.01)
*C23C 16/455* (2006.01)

(52) U.S. Cl.
CPC .... *H01L 21/0228* (2013.01); *C23C 16/45534* (2013.01); *C23C 16/45563* (2013.01); *H01L 21/02205* (2013.01)

(58) Field of Classification Search
None
See application file for complete search history.

(56) References Cited

U.S. PATENT DOCUMENTS

2003/0015764 A1\* 1/2003 Raaijmakers ....... H01L 21/3145
257/E21.546
2007/0259498 A1 11/2007 Chang et al.
2013/0149873 A1 6/2013 Hirose et al.
(Continued)

FOREIGN PATENT DOCUMENTS

JP 2008-034624 A 2/2008
JP 2013-140944 A 7/2013
(Continued)

OTHER PUBLICATIONS

Taiwan Office Action issued on Dec. 7, 2022 for Taiwan Patent Application No. 110146911.
(Continued)

*Primary Examiner* — Feifei Yeung Lopez
(74) *Attorney, Agent, or Firm* — Volpe Koenig

(57) ABSTRACT

There is provided a technique that includes forming a film in a concave portion provided on a surface of a substrate by performing a cycle a predetermined number of times, the cycle including: (a) supplying a precursor to the substrate; (b) supplying a nitrogen-containing reactant to the substrate; and (c) supplying an oxygen-containing reactant to the substrate, wherein in (c), an oxide layer is formed by oxidizing a layer, which has been formed in the concave portion before (c) is performed, and an amount of oxidation of the oxide layer formed in an upper portion in the concave portion is made larger than an amount of oxidation of the oxide layer formed in a lower portion in the concave portion.

20 Claims, 7 Drawing Sheets

(56) References Cited

U.S. PATENT DOCUMENTS

| | | |
|---|---|---|
| 2013/0237064 A1 | 9/2013 | Kirikihira et al. |
| 2015/0214030 A1 | 7/2015 | Kirikihira et al. |
| 2015/0243498 A1 | 8/2015 | Hirose et al. |
| 2016/0365243 A1 | 12/2016 | Hirose et al. |
| 2018/0144980 A1 | 5/2018 | Basu et al. |
| 2018/0269055 A1 | 9/2018 | Hashimoto et al. |
| 2019/0221425 A1 | 7/2019 | Hashimoto et al. |
| 2019/0287787 A1 | 9/2019 | Nishino et al. |
| 2019/0355575 A1 | 11/2019 | Takeshima et al. |
| 2020/0032390 A1 | 1/2020 | Kato |
| 2020/0161170 A1 | 5/2020 | Kao et al. |

FOREIGN PATENT DOCUMENTS

| | | |
|---|---|---|
| JP | 2013-187507 A | 9/2013 |
| JP | 2017-069407 A | 4/2017 |
| JP | 2018-157095 A | 10/2018 |
| KR | 10-2018-0106897 A | 10/2018 |
| KR | 10-2019-0110033 A | 9/2019 |
| KR | 10-2020-0012741 A | 2/2020 |
| KR | 10-2020-0060678 A | 6/2020 |
| TW | 201838030 A | 10/2018 |

OTHER PUBLICATIONS

Singapore Search Report issued on Apr. 18, 2023 for Singapore Patent Application No. 10202200070S.
Singapore Written Opinion issued on Apr. 18, 2023 for Singapore Patent Application No. 10202200070S.
Japanese Office Action issued on Oct. 4, 2022 for Japanese Patent Application No. 2021-013923 .
Korean Office Action issued on Mar. 27, 2024 for Korean Patent Application No. 10-2022-0000230.

* cited by examiner

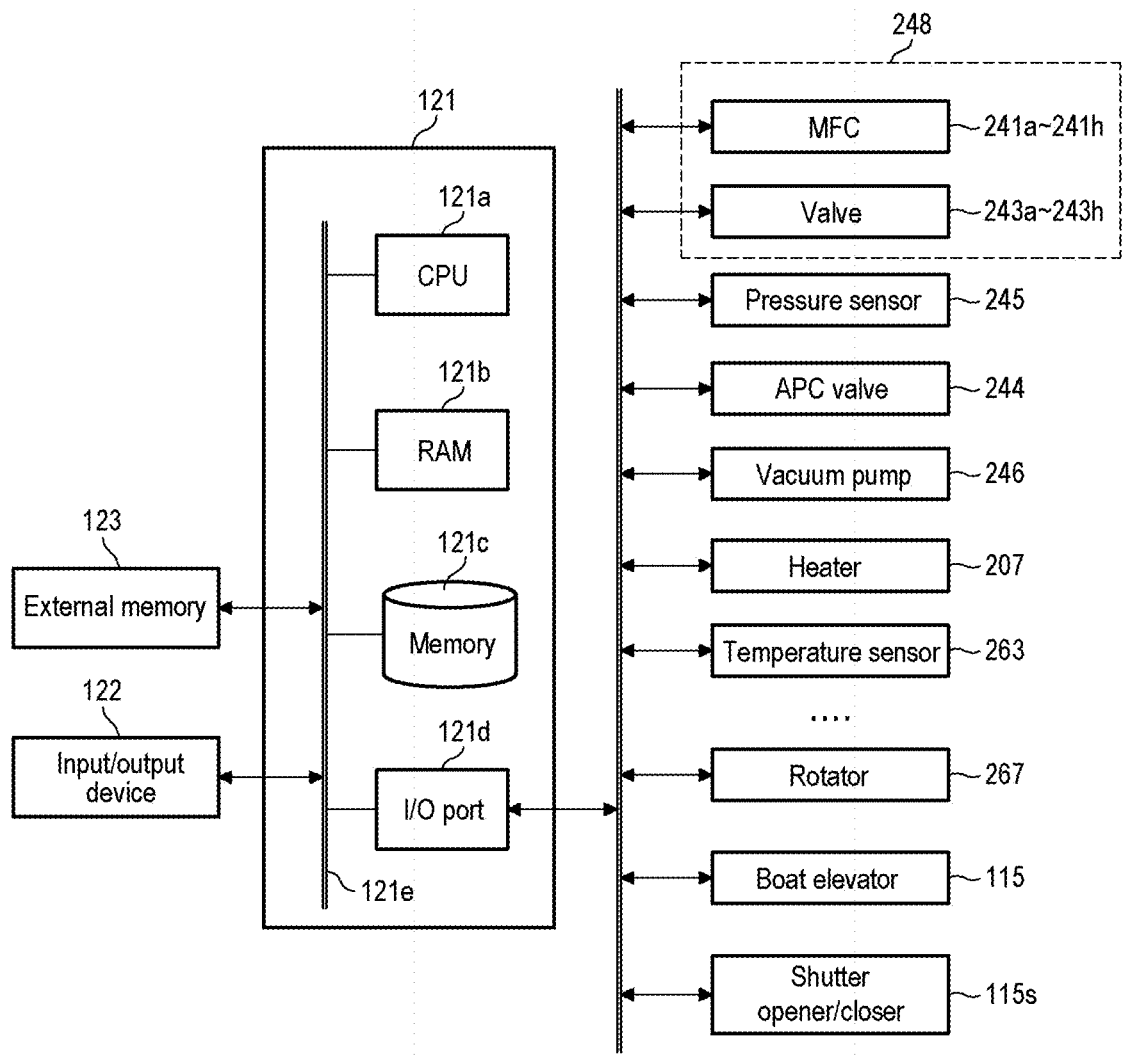

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-013923, filed on Jan. 29, 2021, the entire contents of which are incorporated herein by reference.

TECHNICAL FIELD

The present disclosure relates to a method of manufacturing a semiconductor device, a substrate processing method, a substrate processing apparatus, and a recording medium.

BACKGROUND

As a process of manufacturing a semiconductor device, a process of using a reaction inhibition gas to form a film in a concave portion such as a trench formed on the surface of a substrate is often carried out.

However, when the reaction inhibition gas is used, a film-forming reaction is partially inhibited, and as a result, the total film formation rate is lowered, and a component contained in the reaction inhibition gas is introduced into the film to be formed, which may cause deterioration of the film quality.

SUMMARY

Some embodiments of the present disclosure provide a technique capable of forming a high-quality film at a high film formation rate in a concave portion formed on the surface of a substrate.

According to one embodiment of the present disclosure, there is provided a technique that includes forming a film in a concave portion provided on a surface of a substrate by performing a cycle a predetermined number of times, the cycle including: (a) supplying a precursor to the substrate; (b) supplying a nitrogen-containing reactant to the substrate; and (c) supplying an oxygen-containing reactant to the substrate, wherein in (c), an oxide layer is formed by oxidizing a layer, which has been formed in the concave portion before (c) is performed, and an amount of oxidation of the oxide layer formed in an upper portion in the concave portion is made larger than an amount of oxidation of the oxide layer formed in a lower portion in the concave portion.

BRIEF DESCRIPTION OF DRAWINGS

The accompanying drawings, which are incorporated in and constitute a part of the specification, illustrate embodiments of the present disclosure.

FIG. 3 is a schematic configuration diagram of a controller 121 of the substrate processing apparatus suitably used in the embodiment of the present disclosure, in which a control system of the controller 121 is shown in a block diagram.

FIG. 4A is a partially-enlarged cross-sectional view of the surface of a wafer 200 after a first layer 300 is formed by supply of a precursor in a concave portion 200a.

FIG. 4G is a partially-enlarged cross-sectional view of the surface of the wafer 200 after a cycle in which step A, step B, and step C are performed non-simultaneously is performed a predetermined number of times from the state of FIG. 4F to further stack the third layer 500 in the concave portion 200a, and after a film 600 is embedded in the entire inside of the concave portion 200a.

DETAILED DESCRIPTION

Figure 1:
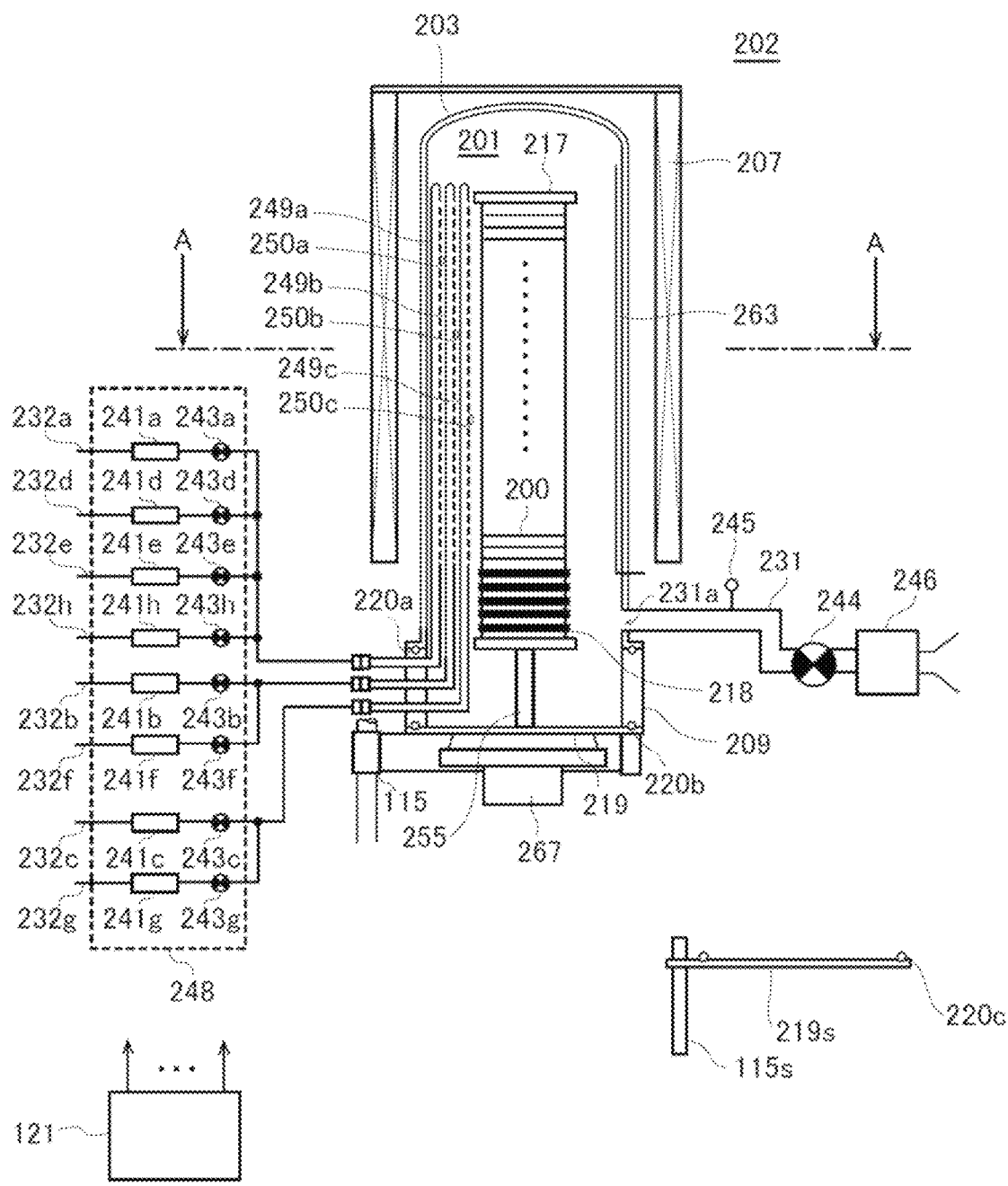
FIG. 1 is a schematic configuration view of a vertical process furnace of a substrate processing apparatus suitably used in an embodiment of the present disclosure, in which a portion of the process furnace 202 is shown in a vertical cross section.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In recent years, due to the three-dimensionalization of a structure of a semiconductor device and the miniaturization of patterns, it has become difficult to control the shape of a film in a process of forming the film on a substrate.

In a CVD (Chemical Vapor Deposition) method, which is generally known as a film forming method, a film forming speed is not isotropic with respect to a three-dimensional substrate surface. When film formation is performed on the three-dimensional substrate surface, that is, a non-planar substrate surface, for example, a substrate surface on which a trench-shaped pattern, a hole-shaped pattern, or both of them are formed, it may be difficult for the existing CVD to control the film thickness inside a concave portion such as a trench or a hole. Especially in the concave portion, the film thickness at the bottom may be thinner than the film thickness at the top, resulting in a film thickness difference (reduction of step coverage). This is because in the CVD method, it is difficult to uniformly supply gas phase-reacted molecules to each place in the concave portion. Further, it is known that the film thickness difference between the bottom and the top in the concave portion becomes larger (the step coverage deteriorates) as an aspect ratio of the concave portion is larger. Further, if the film formation at the top in the concave portion proceeds at a faster speed than that at the bottom in the concave portion to close an opening of the concave portion, the supply of gas phase-reacted molecules or precursor gas into the concave portion may be hindered after the closure, which may generate seams or voids.

In addition to the CVD method, which has these problems, there is also an ALD (Atomic Layer Deposition) method that can obtain an isotropic film formation rate with respect to a three-dimensional substrate surface. However, in this method, there may still occur the above-mentioned problem that the opening of the concave portion is closed, in a case of film formation on the substrate surface including a concave portion such as a trench or a hole proceeding with deep groove or high aspect ratio or in a case of film formation on the substrate surface including a concave portion such as a reverse-tapered trench or hole. As a result, even when the ALD method is used to perform the film formation, seams or voids extending in the depth direction of the concave portion (for example, in the vertical direction) may be generated in the central portion of a film formed in the concave portion.

When the seams or voids are generated in the film formed in the concave portion, a chemical solution passes through the seams or voids generated in the film and permeates into the concave portion in a wet etching process or the like after the film formation, which may cause an adverse effect on a base.

To solve the above-mentioned problems, there is a method of supplying a reaction inhibition gas to the top of the trench and forming a film while lowering the film formation rate only in the top of the trench. However, when the reaction inhibition gas is used, the film-forming reaction is partially inhibited, and as a result, the total film formation rate is lowered, and a component contained in the reaction inhibition gas is introduced into the film to be formed, which may cause deterioration of the film quality.

On the other hand, the present inventors have found that when a film is formed in a concave portion by performing a cycle a predetermined number of times, the cycle non-simultaneously performing (a) a step of supplying a precursor to a substrate with a concave portion formed on a surface of the substrate, (b) a step of supplying a nitrogen-containing reactant to the substrate, and (c) a step of supplying an oxygen-containing reactant to the substrate, in (c), forming an oxide layer by oxidizing a layer, which has been formed in the concave portion before (c) is performed, and making the amount of oxidation of the oxide layer formed in an upper portion of the concave portion larger than the amount of oxidation of the oxide layer formed in an lower portion of the concave portion, it is possible to form a seamless and void-free high-quality film with a high step coverage and a high film formation rate in the concave portion. The present disclosure is based on the above findings found by the present inventors.

One Embodiment of the Present Disclosure

Hereinafter, one embodiment of the present disclosure will be described mainly with reference to FIGS. 1 to 3 and 4A to 4G.

The drawings used in the following description are all schematic, and the dimensional relationship, ratios, and the like of various elements shown in figures may not always match the actual ones. Further, even between the drawings, the dimensional relationship, ratios, and the like of various elements may not always match each other.

(1) Configuration of Substrate Processing Apparatus

As shown in FIG. 1, a process furnace 202 includes a heater 207 as a temperature regulator (a heating part or a heater). The heater 207 has a cylindrical shape and is vertically installed by being supported by a holder. The heater 207 also functions as an activation mechanism (an excitation part) configured to activate (excite) a gas with heat.

A reaction tube 203 is disposed inside the heater 207 to be concentric with the heater 207. The reaction tube 203 is composed of a heat resistant material such as, for example, quartz ($SiO_2$) or silicon carbide (SiC) or the like, and is formed in a cylindrical shape with its upper end thereof closed and its lower end thereof opened. Below the reaction tube 203, a manifold 209 is disposed to be concentric with the reaction tube 203. The manifold 209 is composed of a metal material such as, for example, stainless steel (SUS) or the like, and is formed in a cylindrical shape with both of its upper and lower ends thereof opened. The upper end portion of the manifold 209 engages with the lower end portion of the reaction tube 203 so as to support the reaction tube 203. An O-ring 220a as a seal member is installed between the manifold 209 and the reaction tube 203. Similar to the heater 207, the reaction tube 203 is vertically installed. A process container (reaction container) is mainly composed of the reaction tube 203 and the manifold 209. A process chamber 201 is formed in a hollow cylindrical portion of the process container. The process chamber 201 is configured to accommodate wafers 200 as substrates. Processing on the wafers 200 is performed in the process chamber 201.

Nozzles 249a to 249c as first to third supply parts are installed in the process chamber 201 so as to penetrate through a sidewall of the manifold 209. The nozzles 249a to 249c are also referred to as first to third nozzles, respectively. The nozzles 249a to 249c are composed of, for example, a heat resistant material such as quartz or SiC. Gas supply pipes 232a to 232c are connected to the nozzles 249a to 249c, respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed in the gas supply pipes 232a to 232c, respectively, sequentially from the upstream side of a gas flow. Gas supply pipes 232d, 232e, and 232h are connected to the gas supply pipe 232a at the downstream side of the valve 243a. Gas supply pipes 232f and 232g are connected to the gas supply pipes 232b and 232c at the downstream side of the valves 243b and 243c, respectively. MFCs 241d to 241h and valves 243d to 243h are installed in the gas supply pipes 232d to 232h, respectively, sequentially from the upstream side of a gas flow. The gas supply pipes 232a to 232h are composed of, for example, a metal material such as SUS.

Figure 2:
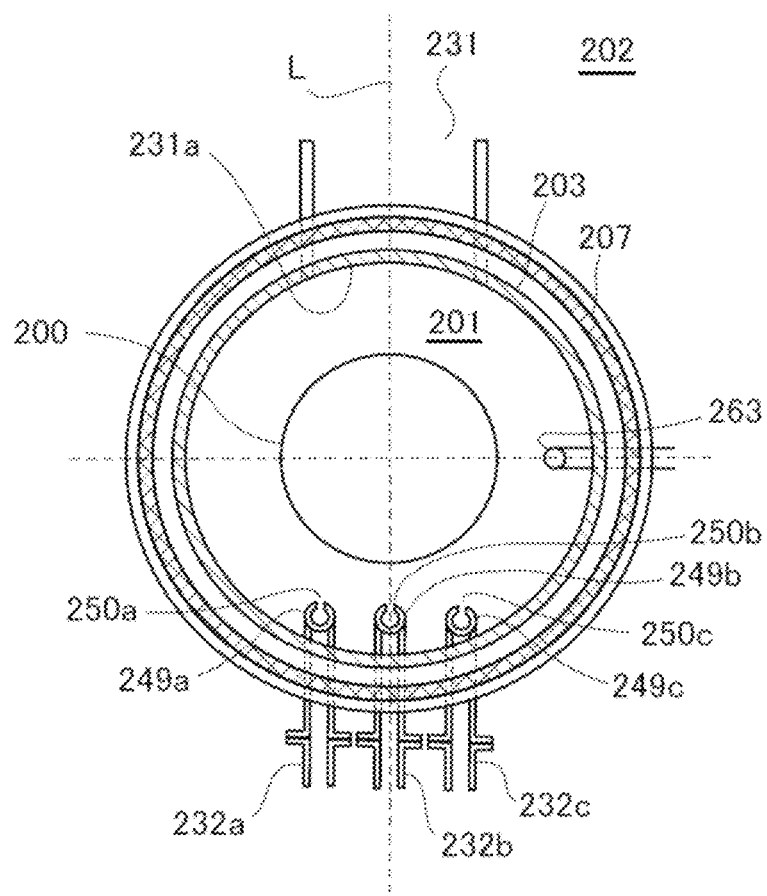
FIG. 2 is a schematic configuration view of the vertical process furnace of the substrate processing apparatus suitably used in the embodiment of the present disclosure, in which a portion of the process furnace 202 is shown in a cross section taken along line A-A in FIG. 1.

As shown in FIG. 2, each of the nozzles 249a to 249c is installed in an annular space in a plane view between an inner wall of the reaction tube 203 and the wafers 200 such that each of the nozzles 249a to 249c extends upward along an arrangement direction of the wafers 200 from a lower portion to an upper portion of the inner wall of the reaction tube 203. Specifically, each of the nozzles 249a to 249c is installed in a region horizontally surrounding a wafer arrangement region in which the wafers 200 are arranged at a lateral side of the wafer arrangement region, along the wafer arrangement region. In a plane view, the nozzle 249b is disposed to face an exhaust port 231a to be described later, on a straight line across the centers of the wafers 200 loaded into the process chamber 201, which are interposed therebetween. The nozzles 249a and 249c are arranged so as to sandwich a straight line L passing through the nozzle 249b and the center of the exhaust port 231a from both sides along the inner wall of the reaction tube 203 (the outer peripheral portion of the wafers 200). The straight line L is also a straight line passing through the nozzle 249b and the centers of the wafers 200. The nozzle 249c may be installed on the side opposite to the nozzle 249a with the straight line L interposed therebetween. The nozzles 249a and 249c are arranged in line symmetry with the straight line L as an axis of symmetry. Gas supply holes 250a to 250c for supplying gases are formed on a side surfaces of the nozzles 249a to 249c, respectively. Each of the gas supply holes 250a to 250c is opened to oppose (face) the exhaust port 231a in a plane view, which enables a gas to be supplied toward the wafers 200. A plurality of gas supply holes 250a to 250c are installed from the lower portion of the reaction tube 203 to the upper portion thereof.

A precursor is supplied from the gas supply pipe 232a into the process chamber 201 via the MFC 241a, the valve 243a, and the nozzle 249a.

A nitrogen (N)-containing reactant is supplied from the gas supply pipe 232b into the process chamber 201 via the MFC 241b, the valve 243b, and the nozzle 249b.

An oxygen (O)-containing reactant is supplied from the gas supply pipe 232c into the process chamber 201 via the MFC 241c, the valve 243c, and the nozzle 249c.

An adsorption inhibitor is supplied from the gas supply pipe 232d into the process chamber 201 via the MFC 241d, the valve 243d, the gas supply pipe 232a, and the nozzle 249a.

An inert gas is supplied from the gas supply pipes 232e to 232g into the process chamber 201 via the MFCs 241e to 241g, the valves 243e to 243g, the gas supply pipes 232a to 232c, and the nozzles 249a to 249c, respectively. The inert gas acts as a purge gas, a carrier gas, a dilution gas, or the like.

An oxygen (O)-containing gas is supplied from the gas supply pipe 232h into the process chamber 201 via the MFC 241h, the valve 243h, the gas supply pipe 232a, and the nozzle 249a.

A precursor supply system mainly includes the gas supply pipe 232a, the MFC 241a, and the valve 243a. A N-containing reactant supply system mainly includes the gas supply pipe 232b, the MFC 241b, and the valve 243b. An O-containing reactant supply system mainly includes the gas supply pipe 232c, the MFC 241c, and the valve 243c. An adsorption inhibitor supply system mainly includes the gas supply pipe 232d, the MFC 241d, and the valve 243d. An inert gas supply system mainly includes the gas supply pipes 232e to 232g, the MFCs 241e to 241g, and the valves 243e to 243g. An O-containing gas supply system mainly includes the gas supply pipe 232h, the MFC 241h, and the valve 243h.

Since the N-containing reactant may act as a nitriding agent (nitriding gas), the N-containing reactant supply system can also be referred to as a nitriding agent (nitriding gas) supply system. Since the O-containing reactant may act as an oxidizing agent (oxidizing gas), the O-containing reactant supply system can also be referred to as an oxidizing agent (oxidizing gas) supply system. Since the N-containing reactant and the O-containing reactant also function as a modifier, the N-containing reactant supply system and the O-containing reactant supply system can each also be referred to as a modifier supply system (a N-containing modifier supply system and an O-containing modifier supply system).

Some or all of the above-described various supply systems may be configured as an integrated supply system 248 in which the valves 243a to 243h, the MFCs 241a to 241h, or the like are integrated. The integrated supply system 248 is configured to be connected to each of the gas supply pipes 232a to 232h, and is configured such that operations of supplying various kinds of gases into the gas supply pipes 232a to 232h (that is, the opening or closing operation of the valves 243a to 243h, the flow rate adjustment operation by the MFCs 241a to 241h, and the like) are controlled by a controller 121 which will be described later. The integrated supply system 248 is configured as an integral type or a division type integrated unit and may be attached to or detached from the gas supply pipes 232a to 232h and the like on an integrated unit basis, so that the maintenance, replacement, expansion, etc. of the integrated supply system 248 can be performed on the integrated unit basis.

The exhaust port 231a for exhausting an atmosphere in the process chamber 201 is installed below a sidewall of the reaction tube 203. As shown in FIG. 2, the exhaust port 231a is installed at a position opposing (facing) the nozzles 249a to 249c (the gas supply holes 250a to 250c) with the wafers 200 interposed therebetween in a plane view. The exhaust port 231a may be installed from a lower portion of the sidewall of the reaction tube 203 to an upper portion thereof, that is, along the wafer arrangement region. An exhaust pipe 231 is connected to the exhaust port 231a. The exhaust pipe 231 is composed of, for example, a metal material such as SUS or the like. A vacuum pump 246 as a vacuum exhauster is connected to the exhaust pipe 231 via a pressure sensor 245, which is a pressure detector (pressure detection part) for detecting the pressure inside the process chamber 201, and an APC (Auto Pressure Controller) valve 244, which is a pressure regulator (pressure regulation part). The APC valve 244 is configured to perform or stop a vacuum-exhausting operation in the process chamber 201 by opening or closing the valve in a state in which the vacuum pump 246 is operated, and is also configured to regulate the pressure inside the process chamber 201 by adjusting an opening degree of the valve based on a pressure information detected by the pressure sensor 245 in a state in which the vacuum pump 246 is operated. An exhaust system mainly includes the exhaust pipe 231, the APC valve 244, and the pressure sensor 245. The exhaust system may include the vacuum pump 246.

A seal cap 219 as a furnace opening lid capable of air-tightly closing a lower end opening of the manifold 209, is installed below the manifold 209. The seal cap 219 is composed of, for example, a metal material such as SUS, and is formed in a disc shape. An O-ring 220b, which is a seal in contact with a lower end of the manifold 209, is installed on an upper surface of the seal cap 219. A rotator 267 configured to rotate a boat 217, which will be described later, is installed below the seal cap 219. A rotary shaft 255 of the rotator 267 is composed of, for example, a metal material such as SUS or the like, and is connected to the boat 217 through the seal cap 219. The rotator 267 is configured to rotate the wafers 200 by rotating the boat 217. The seal cap 219 is configured to be vertically raised or lowered by a boat elevator 115 which is an elevator installed outside the reaction tube 203. The boat elevator 115 is configured as a transfer device (transfer mechanism) which loads or unloads (transfers) the wafers 200 into and out of the process chamber 201 by raising or lowering the seal cap 219.

Below the manifold 209, a shutter 219s is installed as a furnace opening lid capable of air-tightly closing the lower end opening of the manifold 209 in a state where the seal cap 219 is lowered and the boat 217 is unloaded from the process chamber 201. The shutter 219s is composed of, for example, a metal material such as SUS, and is formed in a disc shape. An O-ring 220c, which is a seal in contact with the lower end of the manifold 209, is installed on an upper surface of the shutter 219s. The opening/closing operation (such as the elevating operation, the rotating operation, or the like) of the shutter 219s is controlled by a shutter opener/closer 115s.

The boat 217 as a substrate support is configured to support a plurality of wafers 200, for example, 25 to 200 wafers 200, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is composed of, for example, a heat resistant material such as quartz or SiC. Heat insulating plates 218 composed of, for example, a heat resistant material such as quartz or SiC are supported in multiple stages at the bottom of the boat 217.

A temperature sensor 263 as a temperature detector is installed in the reaction tube 203. By adjusting a degree of conducting electricity of the heater 207 based on temperature information detected by the temperature sensor 263, the temperature inside the process chamber 201 becomes a desired temperature distribution. The temperature sensor 263 is installed along the inner wall of the reaction tube 203.

As shown in FIG. 3, a controller 121, which is a control part (control means), may be configured as a computer including a CPU (Central Processing Unit) 121a, a RAM (Random Access Memory) 121b, a memory 121c, and an I/O port 121d. The RAM 121b, the memory 121c, and the I/O port 121d are configured to exchange data with the CPU 121a via an internal bus 121e. An input/output device 122 configured as, e.g., a touch panel or the like, is connected to the controller 121.

The memory 121c is configured by, for example, a flash memory, a hard disk drive (HDD), or the like. A control program for controlling operations of a substrate processing apparatus, a process recipe in which procedures, conditions, or the like of substrate processing to be described below, etc. are readably stored in the memory 121c. The process recipe is a combination for causing, by the controller 121, the substrate processing apparatus to execute respective procedures in the substrate processing, which will be described later, to obtain a predetermined result. The process recipe functions as a program. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program or data read by the CPU 121a is temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotator 267, the boat elevator 115, the shutter opener/closer 115s, and the like.

The CPU 121a is configured to read and execute the control program from the memory 121c, and to read the recipe from the memory 121c according to an input of an operation command from the input/output device 122. The CPU 121a is configured to be capable of control, according to the contents of the read recipe, the flow-rate-adjusting operation of various kinds of gases by the MFCs 241a to 241h, the opening/closing operation of the valves 243a to 243h, the opening/closing operation of the APC valve 244, the pressure regulating operation performed by the APC valve 244 based on the pressure sensor 245, the actuating and stopping operation of the vacuum pump 246, the temperature-regulating operation performed by the heater 207 based on the temperature sensor 263, the rotation and the rotation speed adjustment operation of the boat 217 by the rotator 267, the raising or lowering operation of the boat 217 by the boat elevator 115, the opening/closing operation of the shutter 219s by the shutter opener/closer 115s, and the like.

The controller 121 may be configured by installing, on the computer, the aforementioned program stored in an external memory 123. Examples of the external memory 123 may include a magnetic disk such as a HDD, an optical disc such as a CD or the like, a magneto-optical disc such as a MO or the like, a semiconductor memory such as a USB memory or a SSD, and the like. The memory 121c or the external memory 123 is configured as a computer-readable recording medium. Hereinafter, the memory 121c and the external memory 123 may be collectively and simply referred to as a "recording medium." When the term "recording medium" is used herein, it may indicate a case of including the memory 121c only, a case of including the external memory 123 only, or a case of including both the memory 121c and the external memory 123. Furthermore, the program may be installed to the computer using communication means such as the Internet or a dedicated line, instead of using the external memory 123.

(2) Substrate Processing Process

As a process of manufacturing a semiconductor device using the above-described substrate processing apparatus, an example of a processing sequence for forming a film in a concave portion 200a formed on the surface of a wafer 200 will be described mainly with reference to FIGS. 4A to 4G. In the following description, the operations of the respective parts constituting the substrate processing apparatus are controlled by the controller 121.

A processing sequence of the present embodiment shown in FIGS. 4A to 4G includes:

forming a film 600 in a concave portion 200a provided on the surface of a wafer 200 by performing a cycle a predetermined number of times, the cycle that performs non-simultaneously:

(a) a step A of supplying a precursor to the wafer 200;
(b) a step B of supplying a N-containing reactant to the wafer 200; and
(c) a step C of supplying an O-containing reactant to the wafer 200.

Then, in the step C, an oxide layer is formed by oxidizing a layer, which has been formed in the concave portion 200a before the step C is performed, and the amount of oxidation of the oxide layer formed in an upper portion in the concave portion 200a is made larger than the amount of oxidation of the oxide layer formed in an lower portion in the concave portion 200a. An example of forming the film 600 so as to be embedded in the concave portion 200a by performing a cycle a predetermined number of times, the cycle that non-simultaneously performs step A, step B, and step C in this order, is shown in FIGS. 4A to 4G.

In the present disclosure, for the sake of convenience, a processing sequence of performing the cycle a predetermined number of times, the cycle that non-simultaneously performs step A, step B, and step C in this order, may be denoted as follows. The same denotation may be used in other embodiments and modifications to be described later.

(Precursor→N-containing reactant→O-containing reactant)×n

When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" or "concave portion," which is a portion of the substrate, is used in the present disclosure, it may be synonymous with the term "wafer."

In the present disclosure, an "upper portion in a concave portion" includes an edge of the concave portion and means the upper half with respect to the depth of the concave portion. On the other hand, a "lower portion in a concave portion" means a portion below the "upper portion in the concave portion" and includes the bottom surface of the concave portion. That is, the "upper portion in the concave portion" means a portion up to ½ of the depth of the concave portion from an edge portion of the concave portion, and the "lower portion in the concave portion" means the bottom surface of the concave portion or a portion up to ½ of the depth of the concave portion from the bottom surface of the concave portion. Further, the "upper portion in the concave portion" may be a portion up to ⅓ of the depth of the concave portion from the edge portion of the concave portion, and the "lower portion in the concave portion" means the bottom surface of the concave portion or a portion up to ⅓ of the depth of the concave portion from the bottom surface of the concave portion.

(Wafer Charging and Boat Loading)

After the boat 217 is charged with a plurality of wafers 200 (wafer charging), the shutter 219s is moved by the shutter opener/closer 115s and the lower end opening of the manifold 209 is opened (shutter open). Thereafter, as shown in FIG. 1, the boat 217 charged with the plurality of wafers 200 is lifted by the boat elevator 115 to be loaded into the process chamber 201 (boat loading). In this state, the seal cap 219 seals the lower end of the manifold 209 through the O-ring 220b.

Figure 4A:
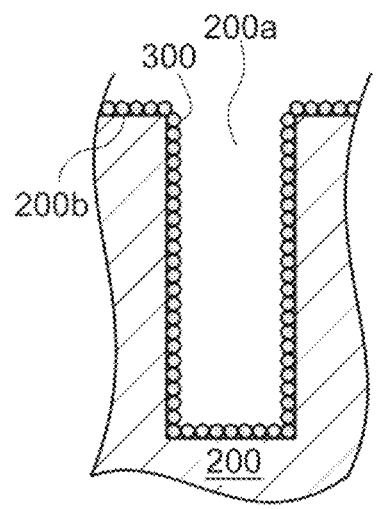

Further, as shown in FIG. 4A, the concave portion 200a is formed on the surface of the wafers 200 which are charged to the boat 217. The surface in the concave portion 200a (the surface of the inner wall of the concave portion 200a) of the wafer 200 and an upper surface 200b which is a portion other than the concave portion 200a of the wafer 200 have a NH group which is an adsorption site over the entire area (entire surface). That is, the surface in the concave portion 200a of the wafer 200 and the upper surface 200b of the wafer 200 have a surface terminated with the NH group over the entire area (entire surface). The NH group as the adsorption site is also referred to as a NH termination.

(Pressure Regulation and Temperature Regulation)

After that, the inside of the process chamber 201, that is, a space where the wafer 200 exists, is vacuum-exhausted (decompression-exhausted) by the vacuum pump 246 so as to reach a desired pressure (vacuum degree). At this time, the pressure inside the process chamber 201 is measured by the pressure sensor 245, and the APC valve 244 is feedback-controlled based on the measured pressure information. Further, the wafers 200 in the process chamber 201 are heated by the heater 207 to reach a desired processing temperature. At this time, the degree of conducting electricity of the heater 207 is feedback-controlled based on the temperature information detected by the temperature sensor 263 so that the inside of the process chamber 201 has a desired temperature distribution. Further, the rotation of the wafers 200 by the rotator 267 is started. The exhaust of the process chamber 201 and the heating and rotation of the wafers 200 are continuously performed at least until the processing on the wafers 200 is completed.

(Step A)

After that, step A is performed. In step A, a precursor is supplied to the wafer 200 in the process chamber 201, that is, the wafer 200 with the concave portion 200a formed on the surface of the wafer 200.

Specifically, the valve 243a is opened to allow the precursor to flow into the gas supply pipe 232a. The flow rate of the precursor is adjusted by the MFC 241a, and the precursor is supplied into the process chamber 201 via the nozzle 249a and is exhausted through the exhaust port 231a. In this operation, the precursor is supplied to the wafer 200. At this time, the valves 243e to 243g may be opened to allow an inert gas to be supplied into the process chamber 201 via the nozzles 249a to 249c, respectively.

The process conditions for supplying the precursor in step A are exemplified as follows.

Processing temperature: 500 to 800 degrees C., specifically 550 to 750 degrees C.

Processing pressure: 1 to 1,200 Pa, specifically 20 to 200 Pa

Precursor supply flow rate: 0.1 to 1.5 slm, specifically 0.1 to 0.5 slm

Precursor supply time: 10 to 60 seconds, specifically 20 to 40 seconds

Inert gas supply flow rate (for each gas supply pipe): 0 to 10 slm, specifically 3 to 7 slm In the present disclosure, the notation of a numerical range such as "1 to 1,200 Pa" means that the lower limit value and the upper limit value are included in the range. Therefore, for example, "1 to 1,200 Pa" means "1 Pa or higher and 1,200 Pa or lower." The same applies to other numerical ranges. The processing temperature means the temperature of the wafer 200, and the processing pressure means the pressure inside the process chamber 201. Further, the supply flow rate: 0 slm means a case where no substance is supplied. These apply equally to the following description.

By supplying the precursor to the wafer 200 under the above-mentioned process conditions, as shown in FIG. 4A, a first layer 300 is formed on the surface in the concave portion 200a of the wafer 200 and the surface of the upper surface 200b. FIG. 4A shows an example in which the first layer 300 is formed in the concave portion 200a of the wafer 200 and on the entire surface of the upper surface 200b. The first layer 300 is formed by physical adsorption or chemical adsorption of precursor molecules, chemical adsorption of a substance in which some of precursor molecules are dissociated, and deposition of thermal decomposition products of the precursor, etc. on the surface in the concave portion 200a (specifically, the adsorption site on the surface in the concave portion 200a) of the wafer 200 and the upper surface 200b (specifically, the adsorption site on the surface of the upper surface 200b). That is, a layer containing a main element (for example, silicon (Si), germanium (Ge), titanium (Ti), or the like), which is contained in at least the precursor and constitutes a film, is formed as the first layer 300. When the precursor contains an element (for example, a halogen element) other than the main element, the element other than the main element may also be contained in the first layer 300.

After the first layer 300 is formed in the concave portion 200a of the wafer 200, the valve 243a is closed to stop the supply of the precursor into the process chamber 201. Then, the interior of the process chamber 201 is vacuum-exhausted to remove the precursors remaining in the process chamber 201 and a gaseous substances generated when the first layer 300 is formed, from the process chamber 201. At this time, the valves 243e to 243g may be opened to allow an inert gas to be supplied into the process chamber 201 via the nozzles 249a to 249c. The inert gas supplied from the nozzles 249a to 249c acts as a purge gas, whereby the interior of the process chamber 201 is purged (purging).

The process conditions for purging in step A are exemplified as follows.
Processing temperature: 500 to 800 degrees C., specifically 550 to 750 degrees C.
Processing pressure: 1 to 500 Pa, specifically 20 to 100 Pa
Inert gas supply flow rate (for each gas supply pipe): 0 to 10 slm, specifically 1 to 5 slm
Inert gas supply time: 5 to 60 seconds, specifically 20 to 40 seconds
—Precursor—

As the precursor, a compound containing a main element (for example, Si, Ge, Ti, or the like) which constitutes the film 600 formed in the concave portion 200a can be used. The precursor specifically contains, for example, a halogen element from the viewpoint of adsorbability to the adsorption site (for example, a NH termination) on the surface in the concave portion 200a. The precursor specifically contains, for example, at least one of chlorine (Cl), fluorine (F), bromine (Br), and iodine (I), as the halogen element, more specifically Cl.

As the precursor, it may possible to use, for example, a halosilane-based gas, and above all, it may specifically be possible to use a chlorosilane-based gas. Here, halosilane means silane including a halogen element as a substituent, and chlorosilane means silane including a chlorine (Cl) as a substituent. Examples of the halogen element contained in halosilane may include the above-mentioned halogen elements, specifically, Cl, F, Br, I, and the like. As the precursor, it may be possible to use halosilane in which the number of Sis contained in one molecule is two or more (specifically two), and above all, it may specifically be possible to use chlorosilane in which the number of Sis contained in one molecule is two or more (specifically two). Furthermore, as the precursor, it may be possible to use halosilane with a Si—Si bond in the molecule, and above all, it may be possible to use chlorosilane with a Si—Si bond in the molecule.

As the precursor, it may be possible to use, e.g., a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane gas ($Si_2Cl_6$, abbreviation: HCDS) gas, or an octachlorotrisilane ($Si_3Cl_8$, abbreviation: OCTS) gas. Further, as the precursor, it may be possible to use, e.g., a fluorosilane-based gas such as a tetrafluorosilane ($SiF_4$) gas or a difluorosilane ($SiH_2F_2$) gas, a bromosilane-based gas such as a tetrabromosilane ($SiBr_4$) gas or a dibromosilane ($SiH_2Br_2$) gas, or an iodosilane-based gas such as a tetraiodosilane ($SiI_4$) gas or a diiodosilane ($SiH_2I_2$) gas.

Further, as the precursor, it may possible to use, e.g., an alkylchlorosilane-based gas such as a dimethyldichlorosilane (($CH_3)_2SiCl_2$) gas, a trimethylchlorosilane (($CH_3)_3SiCl$) gas, a 1,1,2,2-tetrachloro-1,2-dimethyldisilane (($CH_3)_2 Si_2Cl_4$), abbreviation: TCDMDS) gas, or a 1,2-dichloro-1,1,2,2-tetramethyldisilane (($CH_3)_4Si_2Cl_2$, abbreviation: DCTMDS) gas, an alkylfluorosilane-based gas such as a dimethyldifluorosilane (($CH_3)_2SiF_2$) gas or a trimethylfluorosilane (($CH_3)_3SiF$) gas, an alkylbromosilane-based gas such as a dimethyldibromosilane (($CH_3)_2SiBr_2$) gas or a trimethylbromosilane (($CH_3)_3SiBr$) gas, or an alkyliodosilane-based gas such as a dimethyldiiodosilane (($CH_3)_2SiI_2$) gas or a trimethyliodosilane (($CH_3)_3SiI$) gas.

Further, as the precursor, it may be possible to use, e.g., a gas of a compound including a cyclic structure composed of Si and C and including a halogen element, for example, as an alkylenechlorosilane-based gas such as a bis(trichlorosilyl)methane (($SiCl_3)_2CH_2$, abbreviation: BTCSM) gas or a 1,2-bis(trichlorosilyl)ethane (($SiCl_3)_2C_2H_4$, abbreviation: BTCSE) gas, or a 1,1,3,3-tetrachloro-1,3-disilacyclobutane ($C_2H_4Cl_4Si_2$, abbreviation: TCDSCB) gas.

Further, as the precursor, it may be possible to use, e.g., a chlorogermane-based gas such as a chlorogermane ($GeH_3Cl$) gas, a dichlorogermane ($GeH_2Cl_2$) gas, a trichlorogermane ($GeHCl_3$) gas, or a germanium tetrachlororide ($GeCl_4$) gas, a fluorogermane-based gas such as a germanium tetrafluoride ($GeF_4$) gas, a bromogermane-based gas such as a germanium tetrabromide ($GeBr_4$) gas, or an iodogermane-based gas such as a germanium tetraiodide ($GeI_4$) gas.

Further, as the precursor, it may be possible to use, e.g., a gas of a metal halide compound such as a tetrachlorotitanium ($TiCl_4$) gas, a tetrafluorotitanium ($TiF_4$) gas, a tetrabromotitanium ($TiBr_4$) gas, or a tetraiodotitanium ($TiI_4$) gas.

One or more of the above-mentioned gases can be used as the precursor. When the precursor contains Si, the precursor acts as a Si source. When the precursor contains Ge, the precursor acts as a Ge source. When the precursor contains Ti, the precursor acts as a Ti source. Among the above, the precursor may be at least one of halosilane and metal halide.
—Inert Gas—

An example of the inert gas may include a rare gas such as a nitrogen ($N_2$) gas, an argon (Ar) gas, a helium (He) gas, a neon (Ne) gas, or a xenon (Xe) gas. One or more of them can be used as the inert gas. This point equally applies to each step using an inert gas, which will be described later. The inert gas acts as a purge gas, a carrier gas, a dilution gas, or the like.

(Step B)

After step A is completed, step B is performed. In step B, a N-containing reactant is supplied to the wafer 200.

Specifically, the valve 243b is opened to allow the N-containing reactant to flow into the gas supply pipe 232b. The flow rate of the N-containing reactant is adjusted by the MFC 241b, and the N-containing reactant is supplied into the process chamber 201 via the nozzle 249b and exhausted through the exhaust port 231a. In this operation, the N-containing reactant is supplied to the wafer 200. At this time, the valves 243e to 243g may be opened to allow an inert gas to be supplied into the process chamber 201 via the nozzles 249a to 249c, respectively.

The process conditions for supplying the N-containing reactant in step B are exemplified as follows.

Processing temperature: 500 to 800 degrees C., specifically 550 to 750 degrees C.
Processing pressure: 1 to 1,200 Pa, specifically 600 to 1,000 Pa
N-containing reactant supply flow rate: 0.1 to 1.5 slm, specifically 0.2 to 0.8 slm
N-containing reactant supply time: 10 to 120 seconds, specifically 10 to 60 seconds Other process conditions can be the same as the process conditions in step A.

Figure 4B:
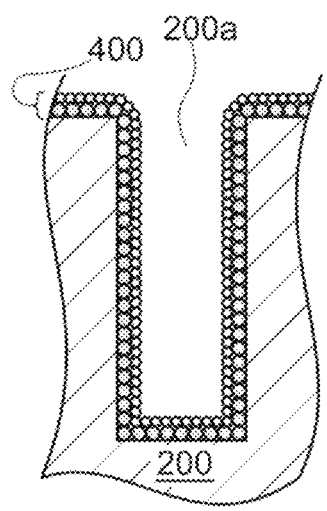
FIG. 4B is a partially-enlarged cross-sectional view of the surface of the wafer 200 after the first layer 300 formed in the concave portion 200a is modified into a second layer 400 by a nitrogen (N)-containing reactant.

By supplying the N-containing reactant to the wafer 200 under the above-mentioned process conditions, a second layer 400 is formed on the surface in the concave portion 200a of the wafer 200, as shown in FIG. 4B. FIG. 4B shows an example in which the second layer 400 is formed on the entire surface in the concave portion 200a of the wafer 200. The second layer 400 is formed by reacting the first layer 300 formed in the concave portion 200a of the wafer 200 with the N-containing reactant. By the reaction between the N-containing reactant and the first layer 300, N contained in the N-containing reactant can be introduced into the first layer 300, and as a result, the second layer 400 containing N is formed. That is, in step B, the first layer 300 can be modified into the second layer 400 containing N by nitridation of the first layer 300 by the N-containing reactant, chemical adsorption of the N-containing reactant on the first layer 300, or the like. Therefore, step B can be referred to as a modifying step by the N-containing reactant. Further, the second layer 400 can also be referred to as a N-containing layer or a nitrided layer (modified layer). Further, when the N-containing reactant contains an element (for example, carbon (C)) other than N, the second layer 400 containing the element other than N can be formed. For example, when the N-containing reactant further contains C, the second layer 400 containing not only N but also C can be formed. In this way, in step B, the composition of the second layer 400 can be adjusted and finely adjusted by the N-containing reactant.

When the second layer 400 is formed, impurities (for example, Cl and the like) contained in the first layer 300 are removed from the first layer 300 in the process of the modification reaction of the first layer 300 by the N-containing reactant. As a result, the second layer 400 becomes a layer including fewer impurities such as Cl than the first layer 300 formed in step A. Further, the impurities removed from the first layer 300 form a gaseous substance to be removed to the outside of the process chamber 201.

After the second layer 400 is formed in the concave portion 200a of the wafer 200, the valve 243b is closed to stop the supply of the N-containing reactant into the process chamber 201. Then, the N-containing reactant remaining in the process chamber 201, the gaseous substance generated when the second layer 400 is formed, and the like are excluded from the process chamber 201 (purging) according to the same processing procedure and process conditions as in the above-described purge in step A.

—N-Containing Reactant—

As the N-containing reactant, a compound capable of modifying the first layer 300 into the second layer 400 can be used. From the viewpoint of this modifying effect, the N-containing reactant may contain, for example, N and hydrogen (H), or specifically contain N, C, and H. That is, as the N-containing reactant, for example, a N- and H-containing gas such as hydrogen nitride or a N-, C-, and H-containing gas such as amine or organic hydrazine can be used. In addition, the N-containing reactant can be used not only by being thermally excited in a non-plasma atmosphere but also by being plasma-excited. That is, the N-containing reactant may be a N-containing reactant excited to a plasma state.

As the N- and H-containing gas, for example, a hydrogen nitride-based gas can be used. As the hydrogen nitride-based gas, for example, a gas containing a N—H bond such as an ammonia ($NH_3$) gas, a hydrazine ($N_2H_4$) gas, a diazene ($N_2H_2$) gas, or a $N_3H_8$ gas can be used.

As the N-, C- and H-containing gas, for example, an amine-based gas can be used. An example of the amine-based gas may include an ethylamine-based gas such as a monoethylamine (($C_2H_5$)$NH_2$, abbreviation: MEA) gas, a diethylamine (($C_2H_5$)$_2$NH, abbreviation: DEA) gas, or a triethylamine (($C_2H_5$)$_3$N, abbreviation: TEA) gas, or a methylamine-based gas such as a monomethylamine (($CH_3$)$NH_2$, abbreviation: MMA) gas, a dimethylamine (($CH_3$)$_2$NH, abbreviation: DMA) gas, or a trimethylamine (($CH_3$)$_3$N, abbreviation: TMA) gas. The amine-based gas is also a N- and H-containing gas.

As the N-, C- and H-containing gas, in addition to the amine-based gas, for example, an organic hydrazine-based gas can be used. An example of the organic hydrazine-based gas may include a methylhydrazine-based gas such as a monomethylhydrazine (($CH_3$)$HN_2H_2$, abbreviation: MMH) gas, a dimethylhydrazine (($CH_3$)$_2N_2H_2$, abbreviation: DMH) gas, or a trimethylhydrazine (($CH_3$)$_2N_2(CH_3)$H, abbreviation: TMH) gas. The organic hydrazine-based gas is also a N- and H-containing gas.

One or more of the above-mentioned gases can be used as the N-containing reactant. The N-containing reactant acts as a N source. When the N-containing reactant contains N and H, the N-containing reactant acts as a N source. When the N-containing reactant contains N, C, and H, the N-containing reactant acts as not only a N source but also a C source.

(Step C)

After step B is completed, step C is performed. In step C, an O-containing reactant is supplied to the wafer 200.

Specifically, the valve 243c is opened to allow the O-containing reactant to flow into the gas supply pipe 232c. The flow rate of the O-containing reactant is adjusted by the MFC 241c, and the O-containing reactant is supplied into the process chamber 201 via the nozzle 249c and is exhausted through the exhaust port 231a. In this operation, the O-containing reactant is supplied to the wafer 200. At this time, the valves 243e to 243g may be opened to allow an inert gas to be supplied into the process chamber 201 via the nozzles 249a to 249c, respectively.

The process conditions for supplying the O-containing reactant in step C are exemplified as follows.

Processing temperature: 500 to 800 degrees C., specifically 550 to 750 degrees C.

Processing pressure: 1 to 1,200 Pa, specifically 600 to 1,000 Pa

O-containing reactant supply flow rate: 0.1 to 10 slm, specifically 0.5 to 5 slm O-containing reactant supply time: 1 to 30 seconds, specifically 1 to 15 seconds, more specifically 1 to 6 seconds Other process conditions can be the same as the process conditions in step A.

Figure 4C:
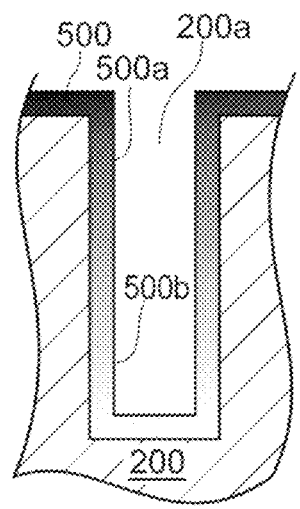
FIG. 4C is a partially-enlarged cross-sectional view of the surface of the wafer 200 after the second layer 400 formed in the concave portion 200a is modified into a third layer 500 by an oxygen (O)-containing reactant.

By supplying the O-containing reactant to the wafer 200 under the above-mentioned process conditions, a third layer 500 is formed on the surface of the concave portion 200*a* of the wafer 200, as shown in FIG. 4C. FIG. 4C shows an example in which the third layer 500 is formed on the entire surface in the concave portion 200*a* of the wafer 200. The third layer 500 is formed by reacting the second layer 400 formed in the concave portion 200*a* (that is, the layer formed in the concave portion 200*a* before step C is performed) of the wafer 200 with the O-containing reactant. By the reaction between the O-containing reactant and the second layer 400, O contained in the O-containing reactant can be introduced into the second layer 400, and as a result, the third layer 500 containing O is formed. That is, in step C, the second layer 400 can be modified into the third layer 500 containing O by oxidation of the second layer 400 by the O-containing reactant. Therefore, step C can also be referred to as a modifying step by the O-containing reactant. Further, the third layer 500 can also be referred to as an O-containing layer or an oxidized layer (modified layer). Further, when the O-containing reactant contains an element (for example, N) other than O, the third layer 500 containing the element other than O can also be formed. For example, when the O-containing reactant further contains N, the third layer 500 containing not only O but also N can be formed. In this way, in step C, the composition of the third layer 500 can be adjusted and finely adjusted by the action of the O-containing reactant.

Then, by supplying the O-containing reactant to the wafer 200 under the above-mentioned process conditions, for the second layer 400 which has been formed in the concave portion 200*a* before the step C is performed, a second layer 400 formed in the upper portion in the concave portion 200*a* can preferentially proceed with oxidation, while a second layer 400 formed in the lower portion in the concave portion 200*a* can be suppressed from the progress of oxidation.

As a result, in step C, as shown in FIG. 4C, for the third layer 500 formed in the concave portion 200*a*, the amount of oxidation of a third layer 500*a* formed in the upper portion in the concave portion 200*a* can be made larger than the amount of oxidation of a third layer 500*b* formed in the lower portion in the concave portion 200*a*. Further, in step C, for the third layer 500 formed in the concave portion 200*a*, an oxidation rate of the third layer 500*a* formed in the upper portion in the concave portion 200*a* can be made higher than an oxidation rate of the third layer 500*b* formed in the lower portion in the concave portion 200*a*. Here, in FIG. 4C, for the third layer 500, a region with larger amount of oxidation (a region with a higher oxidation rate) is indicated by a dark color, and a region with smaller amount of oxidation (a region with a lower oxidation rate) is indicated by a light color. In step C, as shown in FIG. 4C, the third layer 500 including a gradation in which the amount of oxidation becomes gradually large (the oxidation rate becomes gradually high) from the bottom portion in the concave portion 200*a* toward the edge portion in the concave portion 200*a* is obtained.

Further, in step C, for the third layer 500 formed in the concave portion 200*a*, an O content of the third layer 500*a* formed in the upper portion in the concave portion 200*a* can be made larger than the amount of O content of the third layer 500*b* formed in the lower portion in the concave portion 200*a*. Further, in step C, for the third layer 500 formed in the concave portion 200*a*, an O content ratio (O concentration) of the third layer 500*a* formed in the upper portion in the concave portion 200*a* can be made higher than an O content ratio (O concentration) of the third layer 500*b* formed in the lower portion in the concave portion 200*a*. In FIG. 4C, for the third layer 500, a region with a larger amount of O content (a region of a higher O content ratio (O concentration)) is indicated by a dark color, and a region with a smaller amount of O content (a region of a lower O content ratio (O concentration) is indicated by a light color. In step C, as shown in FIG. 4C, the third layer 500 including a gradation in which the O content becomes gradually large (the O content ratio (O concentration) becomes gradually high) from the bottom portion in the concave portion 200*a* toward the edge portion in the concave portion 200*a* is obtained.

As a result, in step C, for the third layer 500 formed in the concave portion 200*a*, the amount of adsorption sites on the surface of the third layer 500*a* formed in the upper portion of the concave portion 200*a* can be made smaller than the amount of adsorption sites on the surface of the third layer 500*b* formed in the lower portion in the concave portion 200*a*. Further, in step C, for the third layer 500 formed in the concave portion 200*a*, a density of adsorption sites on the surface of the third layer 500*a* formed in the upper portion in the concave portion 200*a* can be made lower than a density of adsorption sites on the surface of the third layer 500*b* formed in the lower portion in the concave portion 200*a*. For example, when the adsorption site is a NH termination, in step C, for the third layer 500 formed in the concave portion 200*a*, the amount of NH terminations on the surface of the third layer 500*a* formed in the upper portion of the concave portion 200*a* can be made smaller than the amount of NH terminations on the surface of the third layer 500*b* formed in the lower portion of the concave portion 200*a*. Further, for the third layer 500 formed in the concave portion 200*a*, in step C, a density of NH terminations (NH termination rate) on the surface of the third layer 500*a* formed in the upper portion of the concave portion 200*a* can be made smaller than a density of NH terminations (NH termination rate) on the surface of the third layer 500*b* formed in the lower portion of in the concave portion 200*a*.

In this way, in step C, it is possible to adjust the amount (density) of adsorption sites on the surface of the third layer 500 formed in the concave portion 200*a* depending on the portion in the concave portion 200*a* because the amount of oxidation (oxidation rate) of the third layer 500 formed in the concave portion 200*a* can be adjusted depending on the portion. As the amount of oxidation (oxidation rate) of the third layer 500 formed in the concave portion 200*a* is increased, the amount of disappearance (disappearance rate) of adsorption sites on the surface of the third layer 500 increases, so that the amount (density) of adsorption sites remaining on the surface of the third layer 500 decreases. As the amount of oxidation (oxidation rate) of the third layer 500 formed in the concave portion 200*a* is decreased, the amount of disappearance (disappearance rate) of adsorption sites on the surface of the third layer 500 decreases, so that the decrease in the amount (density) of adsorption sites remaining on the surface of the third layer 500 is suppressed. That is, in step C, for the third layer 500 formed in the concave portion 200a, a portion where the oxidation amount (oxidation rate) is increased can decrease the amount (density) of adsorption sites on the surface thereof, and for the third layer 500 formed in the concave portion 200a, a portion where the oxidation amount (oxidation rate) is decreased can suppress the amount (density) of adsorption sites on the surface thereof.

Among the above-mentioned process conditions, the supply time of the O-containing reactant in step C may be shorter than the supply time of the precursor in step A. This makes it possible to appropriately and efficiently cause the above-mentioned modification reaction (oxidation reaction) in step C, thereby making it possible to appropriately and efficiently form the third layer 500 (500a and 500b) having the above-mentioned characteristics. Further, since the supply time of the precursor in step A is longer than the supply time of the O-containing reactant in step C, the adsorption of the precursor on the adsorption site on the surface of the third layer 500 (500a and 500b) after the second cycle can be optimized, thereby making it possible to further increase the total film formation rate.

Further, for the above-mentioned process conditions, the supply time of the O-containing reactant in step C may be shorter than the supply time of the N-containing reactant in step B. This makes it possible to appropriately and efficiently cause the above-mentioned modification reaction (oxidation reaction), thereby making it possible to appropriately and efficiently form the third layer 500 (500a and 500b) having the above-mentioned characteristics. Further, since the supply time of the N-containing reactant in step B is longer than the supply time of the O-containing reactant in step C, the adsorption site that remains on the surface of the third layer 500 (500a and 500b) can be optimized, thereby making it possible to further increase the total film formation rate.

Further, for the above-mentioned process conditions, the supply time of the O-containing reactant in step C may be shorter than the supply time of the precursor in step A and the supply time of the precursor in step A may be shorter than the supply time of the N-containing reactant in step B. Since the supply time of the O-containing reactant in step C is the shortest, this makes it possible to appropriately and efficiently cause the above-mentioned modification reaction (oxidation reaction), thereby making it possible to appropriately and efficiently form the third layer 500 (500a and 500b) having the above-mentioned characteristics. Further, since the supply time of the N-containing reactant in step B is the longest, the adsorption site that remains on the surface of the third layer 500 (500a and 500b) can be more optimized, and further, since the supply time of the precursor in step A is longer than the supply time of the O-containing reactant, the adsorption of the precursor on the adsorption site on the surface of the third layer 500 (500a and 500b) after the second cycle can be optimized, thereby making it possible to further increase the total film formation rate.

In these cases, the supply time of the O-containing reactant may be set to 1 to 30 seconds, specifically 1 to 15 seconds, more specifically 1 to 6 seconds. If the supply time of the O-containing reactant is shorter than 1 second, the oxidation amount (oxidation rate) of the third layer 500a formed in the upper portion in the concave portion 200a becomes insufficient, and therefore, the effect of reducing the amount (density) of adsorption sites on the surface of the third layer 500a formed in the upper portion in the concave portion 200a may not be sufficiently obtained. By setting the supply time of the O-containing reactant to 1 second or more, this problem can be solved, and the effect of reducing the amount (density) of adsorption sites on the surface of the third layer 500a formed in the upper portion in the concave portion 200a can be sufficiently obtained. If the supply time of the O-containing reactant is longer than 30 seconds, the oxidation amount (oxidation rate) of the third layer 500b formed in the lower portion in the concave portion 200a also increases, and therefore, the amount (density) of adsorption sites on the surface of the third layer 500b formed in the lower portion in the concave portion 200a may decrease more than necessary. By setting the supply time of the O-containing reactant to 30 seconds or shorter, this problem can be solved, and the amount (density) of adsorption sites on the surface of the third layer 500b formed in the lower portion of the concave portion 200a can be suppressed from decreasing more than necessary. This effect can be enhanced by setting the supply time of the O-containing reactant to 15 seconds or shorter, and can be further enhanced by setting the supply time of the O-containing reactant to 6 seconds or shorter.

In step C, by forming the third layer 500 (500a and 500b) having the above-mentioned characteristics in the concave portion 200a of the wafer 200, the amount of adsorption of the precursor on the upper portion of the surface in the concave portion 200a in step A after the second cycle can be made smaller than the amount of adsorption of the precursor on the lower portion of the surface in the concave portion 200a. As a result, in each step after the second cycle, a thickness of a layer formed in the upper portion in the concave portion 200a can be made thinner than a thickness of a layer formed in the lower portion in the concave portion 200a. Specifically, in step A after the second cycle, a thickness of the first layer 300 formed in the upper portion in the concave portion 200a can be made thinner than a thickness of the first layer 300 formed in the lower portion in the concave portion 200a. As a result, in step B after the second cycle, a thickness of the second layer 400 formed in the upper portion in the concave portion 200a can be made thinner than a thickness of the second layer 400 formed in the lower portion in the concave portion 200a. Further, as a result, in step C after the second cycle, a thickness of the third layer 500 (500a) formed in the upper portion in the concave portion 200a can be made thinner than a thickness of the third layer 500 (500b) formed in the lower portion in the concave portion 200a. That is, in step C, in each cycle after the second cycle, it is possible to form the third layer 500 in which the thickness thereof in the lower portion in the concave portion 200a is thicker than the thickness thereof in the upper portion in the concave portion 200a. As a result, it is possible to form a high-quality film with a high step coverage and a high film formation rate in the concave portion 200a. Further, since bottom-up growth is also possible, it is possible to perform void-free and seamless embedding in the concave portion 200a with the high-quality film.

When the third layer 500 is formed, impurities (for example, Cl or the like) contained in the second layer 400 are removed from the second layer 400 in the process of the modification reaction (oxidation reaction) of the second layer 400 by the O-containing reactant. As a result, the third layer 500 becomes a layer including fewer impurities such as Cl than the second layer 400 formed in step B. The impurities removed from the second layer 400 form a gaseous substance to be excluded to the outside of the process chamber 201.

After the third layer 500 having the above-mentioned characteristics is formed in the concave portion 200a of the wafer 200, the valve 243c is closed to stop the supply of the O-containing reactant into the process chamber 201. Then, the O-containing reactant remaining in the process chamber 201, the gaseous substance generated when the third layer 500 is formed, and the like are excluded from the process chamber 201 according to the same processing procedure and process conditions as in the above-described purge in step A.

—O-Containing Reactant—

As the O-containing reactant, a compound capable of modifying the second layer 400 into the third layer 500 can be used. From the viewpoint of this modifying effect, the O-containing reactant may contain, for example, O, O and H, O and N, or O and C. That is, as the O-containing reactant, for example, an O-containing gas, an O- and H-containing gas, an O- and N-containing gas, and an O- and C-containing gas, or the like can be used. In addition, the O-containing reactant can be used not only by being thermally excited in a non-plasma atmosphere but also by being plasma-excited. That is, the O-containing reactant may be an O-containing reactant excited to a plasma state.

As the O-containing gas, for example, oxygen ($O_2$) gas, ozone ($O_3$) gas, or the like can be used. As the O- and H-containing gas, for example, water vapor ($H_2O$ gas), a hydrogen peroxide ($H_2O_2$) gas, an $O_2$ gas+hydrogen ($H_2$) gas, an $O_3$ gas)+$H_2$ gas, or the like can be used. As the O- and N-containing gas, for example, a nitric oxide (NO) gas, a nitrous oxide ($N_2O$) gas, a nitrogen dioxide ($NO_2$) gas, an $O_2$ gas+$NH_3$ gas, an $O_3$ gas)+$NH_3$ gas, or the like can be used. As the O- and C-containing gas, for example, a carbon dioxide ($CO_2$) gas, a carbon monoxide (CO) gas, or the like can be used.

In addition, in the present disclosure, the description of two gases such as "$O_2$ gas+$H_2$ gas" together means a mixed gas of $O_2$ gas and $H_2$ gas. When the mixed gas is supplied, the two gases may be mixed (pre-mixed) in a supply pipe and then supplied into the process chamber 201, or the two gases may be supplied separately from different supply pipes into the process chamber 201 and then mixed (post-mixed) in the process chamber 201.

One or more of the above-mentioned gases can be used as the O-containing reactant. The O-containing reactant acts as an O source. When the O-containing reactant contains O and N, the O-containing reactant may also act as a N source. Further, when the O-containing reactant contains O and C, the O-containing reactant may act as a C source.

(Performing Predetermined Number of Times)

Figure 4D:
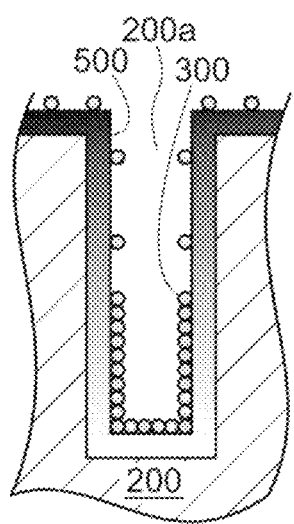
FIG. 4D is a partially-enlarged cross-sectional view of the surface of the wafer 200 after the first layer 300 is formed again by supplying a precursor in the concave portion 200a including the third layer 500 on the surface of the concave portion (that is, the surface of the third layer 500), from the state of FIG. 4C.
Figure 4E:
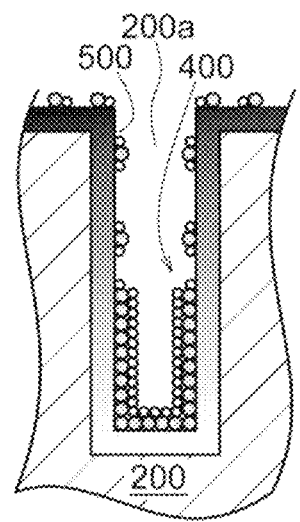
FIG. 4E is a partially-enlarged cross-sectional view of the surface of the wafer 200 after the first layer 300 formed again in the concave portion 200a including the third layer 500 on the surface of the concave portion (that is, the surface of the third layer 500) is converted into the second layer 400 by the N-containing reactant.
Figure 4F:
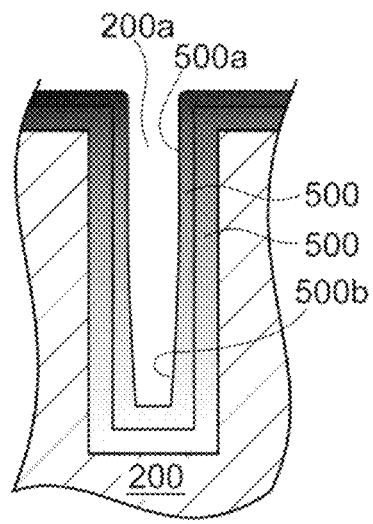
FIG. 4F is a partially-enlarged cross-sectional view of the surface of the wafer 200 after the second layer 400 formed in the concave portion 200a including the third layer 500 on the surface of the concave portion (that is, the surface of the third layer 500) is modified into the third layer 500 by the O-containing reactant.
Figure 4G:
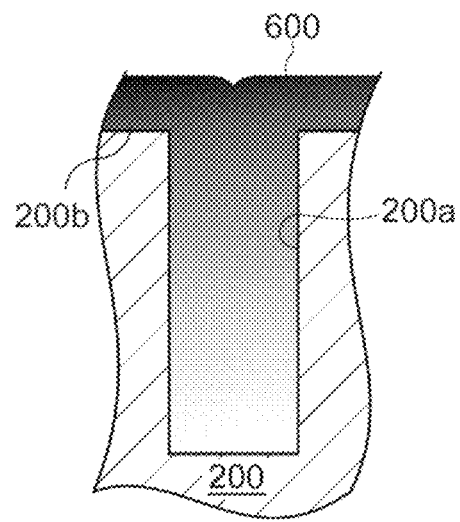

By performing a cycle a predetermined number of times (n times, where n is an integer of 1 or more), the cycle performing non-simultaneously, that is, without synchronization, the above-described step A, step B, and step C, as shown in FIG. 4G, a film 600, which is a laminate of third layers 500, is formed in the concave portion 200a so as to be embedded in the concave portion 200a. That is, by laminating the third layers 500 in the concave portion 200a, the film 600, which is the laminate of the third layer 500, is entirely embedded in the concave portion 200a. The cycle may be repeated a plurality of times. That is, by setting the thickness of the third layer 500 formed per cycle to be thinner than a desired film thickness and laminating the third layers 500, the above cycle may be repeated a plurality of times until the film 600 to be formed reaches the desired film thickness (that is, until the film 600 is embedded in the concave portion 200a).

More specifically, as shown in FIGS. 4A to 4C, after performing the first cycle that performs step A, step B, and step C non-simultaneously in this order, the second cycle that performs step A, step B, and step C non-simultaneously in this order may be performed. That is, as shown in FIG. 4C, in step C, the third layer 500 is formed on the entire surface in the concave portion 200a of the wafer 200. After that, when performing the second cycle, steps A, step B, and step C are performed non-simultaneously in this order on the wafer 200 with the concave portion 200a including the third layer 500 formed on the surface of the wafer 200.

According to step A of the second cycle, as shown in FIG. 4D, from the state of FIG. 4C, the first layer 300 is formed again on the surface of the third layer 500 formed on the entire surface in the concave portion 200a. In this case, as described above, the thickness of the first layer 300 formed in the upper portion of the concave portion 200a can be made thinner than the thickness of the first layer 300 formed in the lower portion of the concave portion 200a. Subsequently, as shown in FIG. 4E, by step B, the second layer 400 is formed again on the surface of the third layer 500 formed on the entire surface in the concave portion 200a. In this case, as described above, the thickness of the second layer 400 formed in the upper portion of the concave portion 200a can be made thinner than the thickness of the second layer 400 formed in the lower portion of the concave portion 200a. Further, subsequently, as shown in FIG. 4F, by step C, the third layer 500 is formed again on the surface of the third layer 500 formed on the entire surface in the concave portion 200a. In this case, as described above, the thickness of the third layer 500a formed in the upper portion of the concave portion 200a can be made thinner than the thickness of the third layer 500b formed in the lower portion of the concave portion 200a. By performing the second cycle in this way, as shown in FIG. 4F, two third layers 500 are laminated in the concave portion 200a. As described above, during the second cycle when the two third layers 500 are laminated or after the second cycle, the third layer 500 which is newly laminated is thicker in the lower portion of the concave portion 200a than in the upper portion of the concave portion 200a. By repeating such a cycle a plurality of times, as shown in FIG. 4G, the film 600, which is the laminate of the third layers 500, is entirely embedded in the concave portion 200a.

Further, by repeating the cycle a plurality of times, the cycle performing step A, step B, and step C non-simultaneously in this order, as shown in FIG. 4G, a reaction similar to the reaction occurring on the surface of the upper portion of the concave portion 200a occurs even on the surface of the upper surface 200b of the wafer 200, and the film 600 is also formed on the upper surface 200b of the wafer 200.

In the present embodiment, the film type of a film formed in the concave portion 200a of the wafer 200 is determined by the type and combination of the precursor, the N-containing reactant, and the O-containing reactant used in step A, step B, and step C. Examples of the film type of the film formed in the concave portion 200a of the wafer 200 may include a silicon oxynitride film (SiON film), a silicon oxycarbonitride film (SiOCN film), a germanium oxynitride film (GeON film), a germanium oxycarbonitride film (GeOCN film), a titanium oxynitride film (TiON film), and a titanium oxycarbonitride film (TiOCN film). These film types are the same in the modifications and other embodiments, which will be described later, except for a case where a film is homogenized by a heat treatment which will be described later.

(After-Purging and Returning to Atmospheric Pressure)

After the film 600 is formed in the concave portion 200a of the wafer 200, an inert gas as a purge gas is supplied into the process chamber 201 from each of the nozzles 249a to 249c and is exhausted through the exhaust port 231a. As a result, the inside of the process chamber 201 is purged to remove a gas, reaction by-products, and the like remaining in the process chamber 201 from the process chamber 201 (after-purging). After that, the atmosphere in the process chamber 201 is replaced with the inert gas (inert gas replacement) and the pressure in the process chamber 201 is returned to the atmospheric pressure (returning to atmospheric pressure).

(Boat Unloading and Wafer Discharging)

After that, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter close). The processed wafers 200 are unloaded from the reaction tube 203 and are discharged from the boat 217 (wafer discharging).

(3) Effects of the Present Embodiment

According to the present embodiment, one or more of the following effects may be achieved.

In step C, by making the oxidation amount (oxidation rate) of the third layer 500a formed in the upper portion of the concave portion 200a larger (higher) than the oxidation amount (oxidation rate) of the third layer 500b formed in the lower portion of the concave portion 200a, the amount (density) of adsorption sites on the surface of the third layer 500a formed in the upper portion of the concave portion 200a can be made smaller (lower) than the amount (density) of adsorption sites on the surface of the third layer 500b formed in the lower portion of the concave portion 200a. For example, when the adsorption site is the NH termination, the amount of NH terminations (NH termination density or NH termination rate) on the surface of the third layer 500a formed in the upper portion in the concave portion 200a can be made smaller (lower) than the amount of NH terminations (NH termination density or NH termination rate) on the surface of the third layer 500b formed in the lower portion in the concave portion 200a.

Further, in step C, by making the O content (O content ratio or O concentration) of the third layer 500a formed in the upper portion of the concave portion 200a larger (higher) than the O content (O content ratio or O concentration) of the third layer 500b formed in the lower portion of the concave portion 200a, the amount (density) of adsorption sites on the surface of the third layer 500a formed in the upper portion in the concave portion 200a can be smaller (lower) than the amount (density) of adsorption sites on the surface of the third layer 500b formed in the lower portion in the concave portion 200a. For example, when the adsorption site is a NH termination, the amount of NH terminations (NH termination density or NH termination rate) on the surface of the third layer 500a formed in the upper portion in the concave portion 200a can be made smaller (lower) than the amount of NH terminations (NH termination density or NH termination rate) on the surface of the third layer 500b formed in the lower portion in the concave portion 200a.

Then, in step C, by making the amount (density) of adsorption sites on the surface of the third layer 500a formed in the upper portion in the concave portion 200a larger (lower) than the amount (density) of adsorption sites on the surface of the third layer 500b formed in the lower portion in the concave portion 200a, the amount of adsorption of the precursor on the upper portion of the surface in the concave portion 200a at least in step A after the second cycle can be smaller than the amount of adsorption of the precursor on the lower portion of the surface in the concave portion 200a. As a result, after the second cycle, the thickness of a layer formed in the upper portion in the concave portion 200a can be made thinner than the thickness of a layer formed in the lower portion in the concave portion 200a. As a result, it is possible to form a high-quality film with a higher step coverage and a higher film formation rate in the concave portion 200a than a technique for forming a film in the concave portion 200a using a reaction inhibition gas (inhibitor). Further, since the thickness of a layer formed in the lower portion in the concave portion 200a can be made thicker than the thickness of a layer formed in the upper portion in the concave portion 200a after the second cycle, the bottom-up growth becomes possible, and therefore, it is possible to perform void-free and seamless embedding in the concave portion 200a with the high-quality film.

For example, there is a method of forming a film in the concave portion 200a while adsorbing an organic inhibitor such as an organic compound on the upper portion of the concave portion 200a. However, in the case of this method, since the organic inhibitor inhibits the adsorption of the precursor, the precursor is hardly adsorbed on the organic inhibitor adsorbed on the upper portion in the concave portion 200a. Further, in the case of this method, there is a high possibility that the residues (residual groups, residual matters, etc.) of the organic inhibitor are introduced into a film to be formed or an interface between the film to be formed and the wafer 200. In contrast, in the case of the present embodiment, as described above, for the third layer 500 formed in step C, the third layer 500a formed in the upper portion of the concave portion 200a apparently acts as a pseudo-inorganic inhibitor. However, in the case of the present embodiment, a small amount of precursors can be adsorbed on the surface of the third layer 500a formed in the upper portion in the concave portion 200a, and more precursors can be adsorbed on the surface of the third layer 500b formed in the lower portion in the concave portion 200a. Further, in the present embodiment, since the organic inhibitor is not used, the residues of the organic inhibitor can be prevented from being introduced into the film to be formed in the concave portion 200a and an interface between the film to be formed and the concave portion 200a. Further, in the present embodiment, since the third layer 500 formed in step C is a layer obtained by modifying the first layer 300 formed in step A in two steps, that is, step B and step C, it is possible to suppress the introduction of impurities into the film to be formed in the concave portion 200a and the interface between the film to be formed and the concave portion 200a. That is, according to the present embodiment, it is possible to form a higher-quality film with a higher film formation rate than a method using an organic inhibitor such as the above-mentioned organic compound. Further, it is possible to improve not only the film quality of the film to be formed but also the characteristics of the interface between the film to be formed and the concave portion 200a.

When the precursor contains a halogen element and the N-containing reactant contains N and H or contains N, C, and H, a reaction (for example, a chemical adsorption reaction) for forming the first layer 300 in step A and a reaction (for example, a modification reaction, a chemical adsorption reaction, or a nitridation reaction) for forming the second layer 400 in step B can be efficiently occurred. Further, even when the precursor used in step A is at least one of halosilane and metal halide and the N-containing reactant used in step B is at least one of hydrogen nitride, amine, and organic hydrazine, the reaction (for example, a chemical adsorption reaction) for forming the first layer 300 in step A and the reaction (for example, a modification reaction, a chemical adsorption reaction, or a nitridation reaction) for forming the second layer 400 in step B can efficiently occur.

(4) Modifications

The above-described processing sequence in the present embodiment can be changed as shown in the following modifications. These modifications can be used in proper combination. Unless described otherwise, the processing procedure and process conditions in each step of each modification can be the same as the processing procedure and process conditions in each step of the above-described processing sequence.

Modification 1

As in the processing sequence shown below, after the process of forming the film 600 in the concave portion 200a according to the above-described processing sequence is performed, the wafer 200 may be performed a heat treatment as post-treatment. Specifically, after performing a process of forming a film 600 in the concave portion 200a by performing a cycle a predetermined number of times, the cycle performing step A, step B, and step C non-simultaneously in this order, step D of performing heat treatment (annealing process) may be performed.

(Precursor→N-containing reactant→O-containing reactant)×n→Heat treatment

In step D, in a state where the temperature of the wafer 200 is set to be equal to or higher than the temperature of the wafer 200 in a step of forming a film (specifically, steps A to C), heat treatment in an O-containing gas atmosphere for the film 600 formed to be embedded in the concave portion 200a may be performed. That is, heat treatment may be performed in the O-containing gas atmosphere by supplying an O-containing gas to the wafer 200. Further, in the heat treatment in step D, from the viewpoint of the heat treatment effect (annealing effect) to be described later, the temperature of the wafer 200 may be set to a temperature higher than the temperature of the wafer 200 in the step of forming the film.

The above-mentioned O-containing gas supply system can be used to supply the O-containing gas to the wafer 200. Specifically, the valve 243h is opened to allow the O-containing gas to flow into the gas supply pipe 232h. The flow rate of the O-containing gas is regulated by the MFC 241h, and the O-containing gas is supplied into the process chamber 201 via the nozzle 249a and is exhausted through the exhaust port 231a. In this operation, the O-containing gas is supplied to the wafer 200, so that an O-containing gas atmosphere is formed in the process chamber 201. At this time, the valves 243e to 243g may be opened to allow an inert gas to be supplied into the process chamber 201 via the nozzles 249a to 249c, respectively.

The process conditions in heat treatment are exemplified as follows.

Processing temperature: 550 to 1,200 degrees C., specifically 700 to 1,000 degrees C., more specifically 700 to 900 degrees C.

Processing pressure: 1 to 101,325 Pa, specifically 67 to 101,325 Pa

O-containing gas supply flow rate (for each gas supply pipe): 0 to 10 slm

O-containing gas supply time: 1 to 240 minutes, specifically 10 to 120 minutes

Other process conditions can be the same as the process conditions in step A.

By performing step D under the above-mentioned process conditions, the film 600 formed to be embedded in the concave portion 200a can be heat-treated. The effect of heat treatment will be described later.

As the O-containing gas used in step D, the same one as the O-containing reactant used in step C can be used. Further, the heat treatment in step D may be plasma heat treatment (plasma annealing) using an O-containing gas excited by plasma.

After the heat treatment is completed, the valve 243h is closed to stop the supply of the O-containing gas into the process chamber 201. Then, the O-containing gas remaining in the process chamber 201, a gaseous substance generated during the heat treatment, and the like are removed from the process chamber 201 (purging) according to the same processing procedure and process conditions as in the above-described step A.

Modification 1 can also obtain the same effects as the above-described embodiment. Further, according to Modification 1, the film 600 formed to be embedded in the concave portion 200a can be expanded by the heat treatment under the above-mentioned O-containing gas atmosphere. As a result, even if a gap such as a seam or a void is generated in the film 600 formed in the concave portion 200a of the wafer 200 due to some factor, it is possible to expand the film 600 by the heat treatment performed in the O-containing gas atmosphere in step D, and the gap can be disappeared (eliminated). That is, according to Modification 1, even if a gap such as a seam or a void is generated in the film 600 formed in the concave portion 200a of the wafer 200, since the film 600 can be complemented, it is possible to perform void-free and seamless embedding in the concave portion 200a.

In step D, the heat treatment may be performed in a state where the film 600 formed to be embedded in the concave portion 200a includes a gap (seam or void) that opens at the upper portion of the film 600. In this case, since the film 600 to be heat-treated includes a gap that opens at the upper portion thereof, the O-containing gas enters the gap through the opening, so that penetration (diffusion) of O contained in the O-containing gas into the film 600 can be promoted, and as a result, the film 600 can be expanded efficiently and uniformly. As a result, even if the gap is generated in the film 600 formed to be embedded in the concave portion 200a, it is possible to efficiently and uniformly disappear (eliminate) the gap by performing step D.

In step D, as described above, the gap formed in the film may be disappeared (eliminated) by expanding the film 600 formed to be embedded in the concave portion 200a. As a result, it is possible to perform void-free and seamless embedding in the concave portion 200a. Thus, the heat treatment in step D may be performed when a gap (seam or void) is generated in the film 600 formed to be embedded in the concave portion 200a, and the heat treatment can also be omitted for a film including no gap.

Figure 4H:
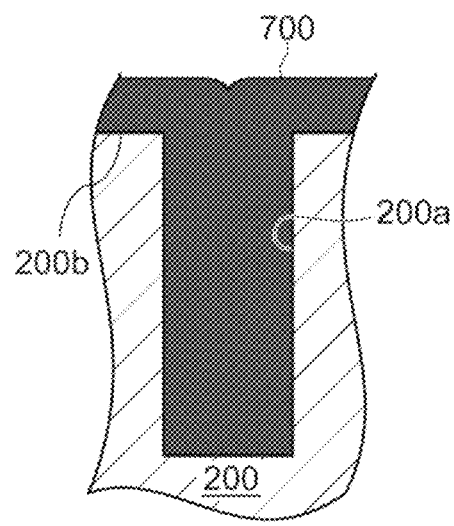
FIG. 4H is a partially-enlarged cross-sectional view of the surface of the wafer 200 after step D is performed from the state of FIG. 4G to homogenize the film 600 embedded in the entire inside of the concave portion 200a to form a film 700.

Further, in Modification 1, the film 600 formed in the concave portion 200a can be homogenized by step D. Specifically, the inside of the concave portion 200a is embedded with the film 600 formed by laminating the third layers 500, but as shown by shading in FIG. 4G, the oxidation amount (oxidation rate) of the film 600 in the upper portion of the concave portion 200a may be different from that of the film 600 in the lower portion of the concave portion 200a. That is, the film 600 formed to be embedded in the concave portion 200a may have different ratios (compositions) of elements contained in the upper portion and the lower portion of the concave portion 200a. Even in such a case, there is no particular problem as long as the embedded film as a whole has the required performance (for example, insulating property). On the other hand, when the film 600 formed to be embedded in the concave portion 200a has different ratios (compositions) of elements contained in the upper portion and the lower portion of the concave portion 200a and it is desired to homogenize this, the heat treatment in step D may be performed. By performing the heat treatment in step D, the film 600 formed to be embedded in the concave portion 200a can be homogenized as a whole. For example, as shown in FIG. 4H, a film 700 with the uniform oxidation amount (oxidation rate) over the entire surface can be obtained. Further, at this time, the film 600 formed on the upper surface 200b of the wafer 200 also becomes homogenized, and as shown in FIG. 4H, a film 700 with the uniform oxidation amount (oxidation rate) over the entire surface from the upper surface 200b of the wafer 200 to the concave portion 200a can be obtained.

When the heat treatment in step D is performed for the purpose of homogenizing the film 600 formed to be embedded in the concave portion 200a, the film 600 is oxidized by the O-containing gas, so that the film 600 is modified to approach the composition of a film (for example, a silicon oxide film (SiO film), a germanium oxide film (GeO film), or a titanium oxide film (TiO film)) by oxide of a main element (for example, Si, Ge, Ti, etc.). Further, when the film 600 is oxidized by the O-containing gas, at least some of Ns and Cs in the film 600 are desorbed, but by adjusting the process conditions such as the O-containing gas supply time, N and C may or may not be left in the homogenized film 700.

Modification 2

As in the processing sequence shown below, in the above-described processing sequence, step E of supplying the wafer 200 with an adsorption inhibitor that suppresses the adsorption of the precursor may be performed before step A at each cycle.

(Adsorption inhibitor→Precursor→N-containing reactant→O-containing reactant)×n

The above-mentioned adsorption inhibitor supply system can be used to supply the adsorption inhibitor to the wafer 200 in step E. Specifically, the valve 243d is opened to allow the adsorption inhibitor to flow into the gas supply pipe 232d. The flow rate of the adsorption inhibitor is regulated by the MFC 241d, and the adsorption inhibitor is supplied into the process chamber 201 via the nozzle 249a and is exhausted through the exhaust port 231a. In this operation, the adsorption inhibitor is supplied to the wafer 200. At this time, the valves 243e to 243g may be opened to allow an inert gas to be supplied into the process chamber 201 via the nozzles 249a to 249c, respectively.

The process conditions for supplying the adsorption inhibitor in step E are exemplified as follows.
Processing temperature: 400 to 800 degrees C., specifically 500 to 800 degrees C., more specifically 500 to 750 degrees C., still more specifically 600 to 750 degrees C.
Processing pressure: 1 to 2,666 Pa, specifically 10 to 266 Pa
Adsorption inhibitor supply flow rate: 0.1 to 1.5 slm, specifically 0.2 to 0.8 slm
Adsorption inhibitor supply time: 5 to 60 seconds, specifically 5 to 55 seconds, more specifically 10 to 50 seconds, still more specifically 15 to 45 seconds, yet still more specifically 20 to 40 seconds
Inert gas supply flow rate (for each gas supply pipe): 0 to 10 slm, specifically 1 to 3 slm By performing step E under the above-mentioned process conditions, the adsorption inhibitor can be adsorbed on the adsorption site in the upper portion of the concave portion 200a of the wafer 200, so that an adsorption inhibit layer can be formed in the upper portion of the concave portion 200a.

After the adsorption inhibition layer is formed in the upper portion of the concave portion 200a of the wafer 200, the valve 243d is closed to stop the supply of the adsorption inhibitor into the process chamber 201. Then, the adsorption inhibitor and the like remaining in the process chamber 201 are removed from the process chamber 201 (purging) according to the same processing procedure and process conditions as in the above-described step A.

—Adsorption Inhibitor—

An example of the adsorption inhibitor may include chlorosilane, for example, a tetrachlorosilane ($SiCl_4$, abbreviation: STC) gas, a trichlorosilane ($HSiCl_3$, abbreviation: TCS) gas, a trichloromethylsilane ($CH_3SiCl_3$) gas, a trichloroethylsilane ($C_2H_5SiCl_3$) gas, a trichloro(dimethylamino)silane (($CH_3)_2NSiCl_3$) gas, or a trichloro(diethylamino)silane (($C_2H_5)_2NSiCl_3$) gas. As the adsorption inhibitor, one or more of these gases can be used. All of these gases are substances that suppress the adsorption of the precursor, but contain a main element constituting the film and react with at least one of the N-containing reactant and the O-containing reactant.

According to Modification 2, as the adsorption inhibition layer is formed in the upper portion in the concave portion 200a of the wafer 200 in step E, the adsorption of the precursor on the adsorption inhibition layer is suppressed in the subsequent step A, and the precursor is adsorbed in a region of the lower portion in the concave portion 200a, where the adsorption inhibition layer is not formed, to form the first layer. As a result, in step A, the first layer is selectively formed in the lower portion in the concave portion 200a of the wafer 200. Then, in the subsequent step B, both the adsorption inhibition layer and the first layer formed in the concave portion 200a of the wafer 200 are modified (nitrided) by the N-containing reactant to form the second layer. Then, in step C, the second layer is modified (oxidized) by the O-containing reactant to form the third layer. That is, the adsorption inhibition layer is modified in the same manner as the first layer in steps B and C after suppressing the adsorption of the precursor, and is changed to a layer same to the layer obtained by modifying the first layer.

Further, in Modification 2, by performing step E under the above-mentioned process conditions, a thickness of the first layer formed in the lower portion in the concave portion 200a of the wafer 200 after passing through step E and step A, can be made thicker than a thickness of the adsorption inhibition layer formed in the upper portion in the concave portion 200a. As a result, a thickness of a layer (the third layer) obtained by modifying the first layer formed in the lower portion in the concave portion 200a of the wafer 200 after passing through step B and step C can be made thicker than a thickness of a layer (the third layer) obtained by modifying the adsorption inhibition layer formed in the upper portion in the concave portion 200a.

Further, in the above-described embodiment, the effect of suppressing the adsorption of the precursor on the upper portion in the concave portion 200a after the second cycle can be obtained, but in Modification 2, the effect of suppressing the adsorption of the precursor on the upper portion in the concave portion 200a from the first cycle can be obtained. Further, in Modification 2, after the second cycle, it is possible to obtain both the effect of suppressing the adsorption of the precursor by the third layer formed in the upper portion in the concave portion 200a in step C and the effect of suppressing the adsorption of the precursor by the adsorption inhibition layer formed in the upper portion in the concave portion 200a in step E. That is, according to Modification 2, it is possible to further enhance the effect of suppressing the adsorption of the precursor on the upper portion in the concave portion 200a.

Thus, according to Modification 2, it is possible to not only obtain the same effects as the above-described embodiment but also form a film with a higher step coverage and a higher film formation rate in the concave portion 200a. Further, since bottom-up growth is possible, it is also possible to perform void-free and seamless embedding in the concave portion 200a.

Other Embodiments of the Present Disclosure

The embodiment of the present disclosure has been specifically described above. However, the present disclosure is not limited to the above-described embodiment, but may be changed in various ways without departing from the gist thereof.

In the above-described embodiment and modifications, the example in which the film 600 is formed to be embedded in the concave portion 200a has been described, but the present disclosure is not limited thereto. For example, a film 600 such as a liner film may be formed along the surface in the concave portion 200a without embedding the film in the concave portion 200a. In this case, the number of cycles may be controlled to stop the film-forming process before the film is embedded in the concave portion 200a. This case can also obtain the same effects as the above-described embodiment. Further, in this case, it is possible to significantly improve the step coverage, which makes it possible to form a conformal film. In particular, a pattern having a large aspect ratio in the concave portion tends to deteriorate the step coverage, but according to the present embodiment, it is possible to form a film having a high step coverage even for a pattern having a large aspect ratio in the concave portion.

In the above-described embodiment and modifications, the example in which a cycle that performs step A, step B, and step C non-simultaneously in this order is performed a predetermined number of times has been described, but the present disclosure is not limited thereto. For example, as in the processing sequences shown below, a film may be formed in the concave portion 200a of the wafer 200 by performing a cycle a predetermined number of times, the cycle performing step A, step C, and step B non-simultaneously in this order. That is, in forming the film in the concave portion 200a of the wafer 200, either the modifying step (step B) using the N-containing reactant or the modifying step (step C) using the O-containing reactant may come first. This case can also obtain the same effects as the above-described embodiment.

(Precursor→O-containing reactant→N-containing reactant)×$n$ (Precursor→O-containing reactant→N-containing reactant)×$n$→Heat treatment (Adsorption inhibitor→precursor→O-containing reactant→N-containing reactant)×$n$ Recipes used in each process may be prepared individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The above-described recipes are not limited to newly-prepared ones but may be prepared, for example, by changing the existing recipes that are already installed in the substrate processing apparatus. In the case of changing the recipes, the changed recipes may be installed in the substrate processing apparatus via a telecommunication line or a recording medium storing the recipes. In addition, the existing recipes already installed in the existing substrate processing apparatus may be directly changed by operating the input/output device 122 of the substrate processing apparatus.

In the above-described embodiments, there has been described an example in which a film is formed using a batch-type substrate processing apparatus capable of processing a plurality of substrates at a time. The present disclosure is not limited to the above-described embodiments, but may be suitably applied, for example, to a case where a film is formed using a single-wafer type substrate processing apparatus capable of processing a single substrate or several substrates at a time. In addition, in the above-described embodiments, there has been described an example in which a film is formed using a substrate processing apparatus provided with a hot-wall-type process furnace. The present disclosure is not limited to the above-described embodiments, but may be suitably applied to a case where a film is formed using a substrate processing apparatus provided with a cold-wall-type process furnace.

Even in the case of using these substrate processing apparatuses, each process may be performed according to the same processing procedures and process conditions as in the above-described embodiments and modifications, and the same effects as in the above-described embodiments and modifications can be achieved.

The above-described embodiments and modifications may be used in proper combination. The processing procedures and process conditions used in this case may be the same as, for example, the processing procedures and process conditions in the above-described embodiments and modifications.

EXAMPLES

Example 1

The substrate processing apparatus shown in FIG. 1 was used to prepare a first evaluation sample in which a cycle that performed step A, step B, and step C non-simultaneously on a wafer having a concave portion on the surface of the wafer was repeated a plurality of times to form a SiOCN film in the concave portion on the wafer surface. When preparing the first evaluation sample, a wafer including a concave portion (trench) having a depth of 3 μm, a width of 100 nm, and an aspect ratio of 30 was used, a $Si_2Cl_6$ gas was used as a precursor, a $(C_2H_5)_3N$ gas was used as a N-containing reactant, and an $O_2$ gas was used as an O-containing reactant. The process conditions in each step when preparing the first evaluation sample were set to predetermined conditions within the process condition range in each step of the processing sequence of the above-described embodiment.

Comparative Example 1

A second evaluation sample in which a SiOCN film was formed in a concave portion on the wafer surface was prepared in the same manner as in the preparation of the first evaluation sample except for the supply time of the O-containing reactant in step C. A wafer, a precursor, a N-containing reactant, an O-containing reactant, the process conditions in step A and step B, and the process conditions in step C except for the supply time of the O-containing reactant in the preparation of the second evaluation sample were the same as those in the preparation of the first evaluation sample. In addition, in step C, the supply time of the O-containing reactant was set to be longer than the supply time of the O-containing reactant in step C in the preparation of the first evaluation sample.

In the first evaluation sample, an oxidation amount (x1) of the SiOCN film formed in the upper portion of the concave portion and an oxidation amount (x2) of the SiOCN film formed in the lower portion of the concave portion were measured to obtain a value (oxidation amount ratio) "X" of oxidation amount (x1)/oxidation amount (x2). In the second evaluation sample, an oxidation amount (y1) of the SiOCN film formed in the upper portion of the concave portion and an oxidation amount (y2) of the SiOCN film formed in the lower portion of the concave portion were measured to obtain a value (oxidation amount ratio) "Y" of oxidation amount (y1)/oxidation amount (y2). As a result, the above-mentioned value (oxidation amount ratio) "X" in the first evaluation sample was larger than 1, and the above-mentioned value (oxidation amount ratio) "Y" in the second evaluation sample was 1.

Next, a step coverage of the SiOCN film in each evaluation sample was measured. Here, the step coverage was obtained by using a thickness ($T_{TOP}$) of the SiOCN film formed in the upper portion (edge) in the concave portion and a thickness ($T_{BOT}$) of the SiOCN film formed in the lower portion in the concave portion, which were measured from an image (SEM image) of each evaluation sample, and substituting these thicknesses into the following equation (1).

$$\text{Step coverage (\%)} = [T_{BOT}/T_{TOP}] \times 100 \qquad \text{Equation (1):}$$

Table 1 below shows the measurement results of the step coverage of the SiOCN film in each evaluation sample. Here, the values of the step coverage shown in Table 1 are relative values when the measured value of the step coverage of the SiOCN film in the second evaluation sample is "100." In addition, Table 1 also shows the above-mentioned values (oxidation amount ratios) "X" and "Y" in each evaluation sample.

TABLE 1

|  |  | Oxidation amount ratio | Step coverage |
|---|---|---|---|
| Example 1 | First evaluation sample | X > 1 | 102 |
| Comparative Example 1 | Second evaluation sample | Y = 1 | 100 |

From Table 1, it was confirmed that Example 1 can improve the step coverage over Comparative Example 1.

Example 2

The substrate processing apparatus shown in FIG. 1 was used to prepare a third evaluation sample in which a cycle that performed step A, step B, and step C non-simultaneously on a wafer having a concave portion on the surface of the wafer was repeated a plurality of times to form a SiON film in the concave portion on the wafer surface. When preparing the third evaluation sample, a wafer including a concave portion (trench) having a depth of 3 μm, a width of 100 nm, and an aspect ratio of 30 was used, a $SiCl_4$ gas was used as a precursor, an $NH_3$ gas was used as a N-containing reactant, and an $O_2$ gas was used as an O-containing reactant. The process conditions in each step when preparing the third evaluation sample were set to predetermined conditions within the process condition range in each step of the processing sequence of the above-described embodiment.

Comparative Example 2

A fourth evaluation sample in which a SiN film was formed in a concave portion on the wafer surface was prepared in the same manner as in the preparation of the third evaluation sample except that step C is not performed. A wafer, a precursor, a N-containing reactant, and the process conditions in step A and step B in the preparation of the fourth evaluation sample were the same as those in the preparation of the third evaluation sample.

In the third evaluation sample, an oxidation amount (z1) of the SiON film formed in the upper portion of the concave portion and an oxidation amount (z2) of the SiON film formed in the lower portion of the concave portion were measured to obtain a value (oxidation amount ratio) "Z" of oxidation amount (z1)/oxidation amount (z2). In addition, a step coverage of the SiON film in the third evaluation sample and a step coverage of the SiN film in the fourth evaluation sample were also measured by the same methods as described above.

Table 2 below shows the measurement results of the above-mentioned value (oxidation amount ratio) "Z" in the third evaluation sample and the step coverage of the SiON film in the third evaluation sample and the step coverage of the SiN film in the fourth evaluation sample. Here, the values of the step coverage shown in Table 2 are relative values when the measured value of the step coverage of the fourth evaluation sample is "100."

TABLE 2

|  |  | Oxidation amount ratio | Step coverage |
|---|---|---|---|
| Example 2 | Third evaluation sample | Z > 1 | 105 |
| Comparative Example 2 | Fourth evaluation sample | — | 100 |

From Table 2, it was confirmed that Example 2 can improve the step coverage over Comparative Example 2.

According to the present disclosure in some embodiments, it is possible to form a high-quality film at a high film formation rate in a concave portion formed on the surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming a film in a concave portion provided on a surface of the substrate by performing a cycle a predetermined number of times, the cycle including:
   (a) supplying a precursor to the substrate;
   (b) supplying a nitrogen-containing reactant to the substrate; and
   (c) supplying an oxygen-containing reactant to the substrate,
   wherein in (c), an oxide layer is formed by oxidizing a layer, which has been formed in the concave portion before (c) is performed, and an oxidation rate of the oxide layer formed in an upper portion in the concave portion is made higher than an oxidation rate of the oxide layer formed in a lower portion in the concave portion.

2. The method according to claim 1, wherein in (c), an oxygen content of the oxide layer formed in the upper portion in the concave portion is made larger than an oxygen content of the oxide layer formed in the lower portion in the concave portion.

3. The method according to claim 1, wherein in (c), an oxygen concentration of the oxide layer formed in the upper portion in the concave portion is made higher than an oxygen concentration of the oxide layer formed in the lower portion in the concave portion.

4. The method according to claim 1, wherein in (c), an amount of adsorption sites on a surface of the oxide layer formed in the upper portion in the concave portion is made smaller than an amount of adsorption sites on a surface of the oxide layer formed in the lower portion in the concave portion.

5. The method according to claim 1, wherein in (c), a density of adsorption sites on a surface of the oxide layer formed in the upper portion in the concave portion is made lower than a density of adsorption sites on a surface of the oxide layer formed in the lower portion in the concave portion.

6. The method according to claim 1, wherein in (c), an amount of NH terminations on a surface of the oxide layer formed in the upper portion in the concave portion is made smaller than an amount of NH terminations on a surface of the oxide layer formed in the lower portion in the concave portion.

7. The method according to claim 1, wherein in (c), a density of NH terminations on a surface of the oxide layer formed in the upper portion in the concave portion is made smaller than a density of NH terminations on a surface of the oxide layer formed in the lower portion in the concave portion.

8. The method according to claim 1, wherein a supply time of the oxygen-containing reactant is made shorter than a supply time of the precursor.

9. The method according to claim 1, wherein a supply time of the oxygen-containing reactant is made shorter than a supply time of the nitrogen-containing reactant.

10. The method according to claim 1, wherein a supply time of the oxygen-containing reactant is made shorter than a supply time of the precursor, and the supply time of the precursor is made shorter than a supply time of the nitrogen-containing reactant.

11. The method according to claim 1, wherein in (a), the precursor is adsorbed on a surface in the concave portion, and
   wherein by performing (c), in (a) during or after a second cycle, an amount of adsorption of the precursor on an upper portion of the surface in the concave portion is made smaller than an amount of adsorption of the precursor on a lower portion of the surface in the concave portion.

12. The method according to claim 1, wherein by performing (c), in (a) during or after a second cycle, a thickness of a layer formed in the upper portion in the concave portion is made thinner than a thickness of a layer formed in the lower portion in the concave portion.

13. The method according to claim 1, wherein the precursor contains halogen, and the nitrogen-containing reactant contains nitrogen and hydrogen, or contains nitrogen, carbon, and hydrogen.

14. The method according to claim 1, wherein the precursor includes at least one selected from the group of halosilane and metal halide, and the nitrogen-containing reactant includes at least one selected from the group of hydrogen nitride, amine, and organic hydrazine.

15. The method according to claim 1, wherein in the act of forming the film, the film is formed to be embedded in the concave portion.

16. The method according to claim 15, further comprising: performing a heat treatment to the film formed to be embedded in the concave portion in an oxygen-containing gas atmosphere in a state where a temperature of the substrate is set to be equal to or higher than a temperature of the substrate in the act of forming the film.

17. The method according to claim 16, wherein in the act of performing the heat treatment, the heat treatment is performed in a state where the film formed to be embedded in the concave portion includes seams or voids.

18. The method according to claim 17, wherein in the act of performing the heat treatment, the seams or voids disappear by expanding the film.

19. A method of manufacturing a semiconductor device, comprising:
   forming a film in a concave portion provided on a surface of a substrate by performing a cycle a predetermined number of times, the cycle including:

(a) supplying a precursor to the substrate;
(b) supplying a nitrogen-containing reactant to the substrate; and
(c) supplying an oxygen-containing reactant to the substrate, wherein in (c), an oxide layer is formed by oxidizing a layer, which has been formed in the concave portion before (c) is performed, and an oxidation rate of the oxide layer formed in an upper portion in the concave portion is made higher than an oxidation rate of the oxide layer formed in a lower portion in the concave portion.

20. A non-transitory computer-readable recording medium storing a program that causes, by a computer, a substrate processing apparatus to perform a process comprising:

forming a film in a concave portion provided on a surface of a substrate by performing a cycle a predetermined number of times, the cycle including:
(a) supplying a precursor to the substrate,
(b) supplying a nitrogen-containing reactant to the substrate, and
(c) supplying an oxygen-containing reactant to the substrate; and wherein in (c), an oxide layer is formed by oxidizing a layer, which has been formed in the concave portion before (c) is performed, and an oxidation rate of the oxide layer formed in an upper portion in the concave portion is made higher than an oxidation rate of the oxide layer formed in a lower portion in the concave portion.

\* \* \* \* \*